(12) United States Patent
Shohara

(10) Patent No.: US 6,463,266 B1
(45) Date of Patent: Oct. 8, 2002

(54) RADIO FREQUENCY CONTROL FOR COMMUNICATIONS SYSTEMS

(75) Inventor: Aki Shohara, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/477,720

(22) Filed: Jan. 5, 2000

Related U.S. Application Data

(60) Provisional application No. 60/147,821, filed on Aug. 10, 1999.

(51) Int. Cl.$^7$ ................................................. H04B 1/16
(52) U.S. Cl. ................ 455/196.1; 455/131; 455/182.1; 455/192.1; 375/219; 375/345; 714/100
(58) Field of Search ................................. 455/196.1, 95, 455/219, 20, 21, 22, 24, 550, 91, 575, 130, 131, 138, 139, 182.1, 182.2, 192.1, 192.2, 197.1; 375/279, 219, 296, 303, 334, 208, 341, 345; 714/100, 48, 746

(56) References Cited

U.S. PATENT DOCUMENTS

| | | | | |
|---|---|---|---|---|
| 5,657,344 A | * | 8/1997 | Na ............................. | 370/280 |
| 5,790,957 A | * | 8/1998 | Heidari ...................... | 455/412 |
| 5,822,366 A | * | 10/1998 | Rapeli ........................ | 329/308 |
| 6,034,990 A | * | 3/2000 | Kang .......................... | 332/100 |
| 6,133,804 A | * | 10/2000 | Wagner et al. .............. | 332/100 |
| 6,151,369 A | * | 11/2000 | Ohkubo et al. ............. | 375/332 |
| 6,298,227 B1 | * | 10/2001 | Molnar ...................... | 455/226.1 |

\* cited by examiner

*Primary Examiner*—William Trost
*Assistant Examiner*—Congvan Tran
(74) *Attorney, Agent, or Firm*—Edward J. Kondracki; Miles & Stockbridge P.C.

(57) ABSTRACT

The present invention provides for a system and method for improvement of radio transmitter and receiver frequency accuracy for a local radio communication unit that communicates digital data with a remote communication unit. In the local unit the received radio signal is down-converted, and converted to complex baseband digital samples by an analog-to-digital converter. A downlink digital phase rotator applies a fine frequency shift to the samples in accordance with a receiver frequency offset command. The resultant baseband signal is used by the data demodulator and by a receiver frequency error estimator to obtain receiver frequency errors. A data modulator generates baseband complex samples which are shifted in carrier frequency by an integrated uplink digital phase rotator in accordance with a transmitter frequency offset command. The modulated samples are then converted by a digital-to-analog converter and upconverted in frequency for radio transmission to the remote unit. The local oscillator signals for both upconverter and downconverter are phase locked to a reference frequency generated by a VCXO. An automatic frequency control (AFC) function nulls the transmitter and receiver frequency error by the frequency adjustment commands to the uplink and downlink phase rotators or to the VCXO digital-to-analog converter (VCXO DAC) by feedback control principals based on measured receiver frequency error. During frequency track mode when communications between local and remote units are possible, the AFC only adjusts radio frequency via phase rotator commands and the VCXO command remains fixed, thereby avoiding communications performance degradation by VCXO frequency quantization error due to the VCXO DAC. The AFC adjusts VCXO frequency only during a preliminary acquisition mode prior to data communications, or to back out excessively large frequency offsets accumulated in the downlink and uplink phase rotators during track mode. When a VCXO adjustment is made in track mode, phase rotator adjustments are simultaneously applied to cancel the errors in transmitter and receiver radio frequencies caused by the step change due to VCXO frequency quantization thereby mitigating VCXO frequency quantization noise.

33 Claims, 6 Drawing Sheets

RADIO FREQUENCY CONTROL FOR COMMUNICATIONS SYSTEMS

This application claims the benefit of provisional application No. 60/147,821, filed Aug. 10, 1999.

BACKGROUND OF THE INVENTION

1. Field of the Invention

This invention relates to apparatuses and methods for improvement of radio transmitter and receiver frequencies of a local radio communication unit that is communicating digital data with a remote communication unit.

2. Description of Related Art

Communication systems often comprise a plurality of local units such as radiotelephone handsets that communicate digital data by radio transmissions with a remote unit such as a cellular phone base station. The radio frequencies of the communication channels and frequency error tolerances for transmissions on the channels are typically specified by regulatory rules. For example, for the GSM mobile telephony standard [Ref. 1], the frequency tolerance is specified to be 0.05 ppm for the base station and 0.1 ppm for the handset. The frequency tolerances ensure that the level of radio interference between channels is tolerable and that accurate data demodulation is possible at the local unit and the remote unit. In the base station the transmitter and receiver radio frequencies are typically phase locked to very stable reference oscillator signal available in the base stations in order to meet the radio frequency tolerances specified by regulations. However, the cost of such stable reference oscillators are typically prohibitive for the handsets, so that provision for accurate transmitter and receiver frequencies in the local unit at lowest possible cost is important.

In a local communication unit the conventional solution for accurate radio frequencies is the use of a relatively low cost voltage controlled crystal oscillator (VCXO) to serve as a reference oscillator wherein the oscillator frequency is approximately linearly related to the magnitude of a VCXO control voltage. The transmitter and receiver radio frequencies are phase locked to the VCXO oscillator frequency, but the frequency error in parts per million (ppm) of the transmitter and receiver, or equivalently the frequency error of the VCXO, is not sufficiently accurate with a free running VCXO to meet frequency tolerance specifications. Therefore, the VCXO control voltage is adjusted based on estimated radio frequency error of the receiver in accordance with well known feedback control principals such that the radio frequency errors of the receiver and transmitter are sufficiently reduced by feedback control principals. This methodology for radio frequency control in the local unit is a conventional automatic frequency control (AFC) loop. With modern electronics the analog VCXO control voltage is generated by a digital-to-analog converter (DAC), and the digital feedback control signal applied to the DAC is produced by AFC digital control logic.

A drawback associated with the conventional AFC loop is that the achievable accuracy of the normalized VCXO frequency in ppm, or equivalently the normalized transmitter and receiver RF frequencies in ppm derived therefrom, is limited by the digital-to-analog converter (DAC) quantization error. The DAC step size or quantization error associated with a least significant bit change in the DAC control signal represents the frequency control resolution of the VCXO. The associated VCXO frequency quantization error is an irreducible systematic bias error and not a random error reducible by averaging or filtering in the AFC tracking loop.

The magnitude of frequency quantization error is dependent primarily on two parameters, the number of bits N represented in the DAC and the characteristic slope of the VCXO. The characteristic slope S of the VCXO is defined as the ratio of the normalized frequency change in units of parts per million (ppm) to change in the control voltage. Let B equal the voltage control span of an N-bit DAC. Then the VCXO frequency quantization error q in Hz/LSB is given by $$q = S*B/2^N$$

Generally, a lower cost VCXO requires a larger frequency swing per volt to correct the larger frequency errors; i.e., a lower cost VCXO tends to have a larger value for the characteristic slope S and hence larger VCXO quantization error. Therefore, with the conventional AFC loop, usage of a lower cost VCXO is constrained by the maximum tolerable level of DAC quantization error which is related to radio frequency tolerance specifications. This is an important constraint because the VCXO typically represents a major cost component in a local unit such as a radio telephone.

As a numerical example of VCXO frequency quantization error induced by the VCXO DAC, the NDK5411B [Ref. 2], which is a high quality VCXO suitable for radio telephone usage, has a characteristic slope of S=15 ppm per volt. A typical DAC implemented in modern integrated circuit technology has a voltage span of B=2 volts with N=10 bits of resolution, and the resultant VCXO frequency quantization error is q=0.03 ppm/LSB. The VCXO frequency quantization error represents a substantial fraction of the frequency tolerance of 0.1 ppm allowed for local units under GSM specifications so that there is very little margin for usage of a lower cost VCXO having a larger quantization error. This example teaches how VCXO quantization error is an important factor in the cost of the local unit.

Another drawback of the conventional AFC is susceptibility of the VCXO frequency to DAC switching noise in addition to the DAC quantization step when the ADC digital control word changes. A common method for mitigation of DAC switching noise is the introduction of a filter with a long time constant, for example one millisecond, between the VCXO and its controlling DAC. This has the drawback that such filtering in the VCXO controller DAC response can significantly extend the settling time of the VCXO in recovery to its original reference frequency immediately after termination of sleep mode. Sleep mode is an interval of inactivity between scheduled communication transactions when all inactive components of the local unit, including VCXO, is powered off to conserve battery life for portable local units. Near termination of sleep mode, the VCXO is powered back on with scheduled allowance for oscillator settling time. Thus, a longer settling time implies a reduction in the power down interval with a consequent reduction in the battery savings. Sleep mode is commonly used in portable communication units such as pagers and cellular phones during idle intervals in standby mode.

Another deficiency of the conventional AFC loop is that the local unit processing of data bursts exhibit large timing errors and VCXO frequency errors when the local unit is powered on. AFC tracking loops are typically inefficient in reducing such large initial errors and for this reason, before the AFC tracking loop is closed, a prior acquisition phase is typically employed to reduce the large initial time and frequency errors to sufficiently small values that efficient closed loop AFC tracking can be switched in and accurate data demodulation performed. The reduction of timing error is a synchronization function which is performed by conventional means and not described in this disclosure. The acquisition time, or duration of the acquisition phase, represents a wasted overhead interval before track mode when accurate data communications is possible so that acquisition time must be reduced to the smallest possible value.

In the local unit local oscillator (LO) signals are generated to serve as mixer signals for frequency upconversion and downconversion. Typically, a subsystem of phase locked loop (PLL) frequency synthesizers and voltage control oscillators (VCO) generate the LO signals which are phase locked to the VCXO signal [Ref. 3]. The PLL/VCXO subsystem and the frequency downconversion and upconversion operations are configured so that the local unit transmitter and receiver radio frequencies have zero frequency error on the assigned channels when the VCXO is operating at its specified nominal frequency. At initiation of acquisition mode, the normalized VCXO frequency error in units of ppm, or equivalently the normalized RF frequency errors of the transmitter and receiver in ppm, have many error contributors, but the two most dominant sources are the VCXO temperature characteristic and aging. The temperature characteristic is a reflection of temperature sensitivity of the crystal and components of the oscillator circuit. Aging is VCXO frequency error caused by aging of the VCXO crystal.

Factory calibration determines the nominal control voltage for the VCXO at which the specified nominal frequency of the VCXO is achieved at a specified nominal temperature T0, where typically T0=25 degrees C. After calibration, the VCXO frequency will deviate from the specified frequency over a specified operating temperature range and the temperature sensitivity is the specified tolerance on VCXO frequency over the specified temperature range. The drift rate of VCXO frequency due to aging of the VCXO crystal is typically given in units of ppm per year. As an example a high quality temperature compensated VCXO suitable for a radio telephone handset, the NDK5411B [Ref. 2], has a specified frequency of 13.000 Mhz with a temperature sensitivity specification of +/−2.5 ppm over a temperature range of −20 degrees C. to +75 degrees C., with an aging specification of +/−1.0 ppm per year.

The cost of the VCXO increases as specifications on temperature sensitivity and aging are tightened. A commonly used technique for reduction of VCXO temperature sensitivity is the integration of a temperature compensation circuit with the VCXO oscillator circuit. The compensation circuit corrects or compensates for the VCXO temperature characteristic by integration of a compensating circuit with the oscillator circuit. The compensating circuit generates an incremental adjustment to the VCXO analog control voltage such that variation of VCXO frequency with temperature is reduced over the specified temperature range. The additional cost of the compensation circuit increases with compensation accuracy. For this reason, an acquisition algorithm with a greater tolerance for VCXO temperature sensitivity and aging facilitates the use a lower cost VCXO or reduction of the acquisition time.

A low cost VCXO with little or no temperature compensation typically has a large temperature sensitivity specification in which the VCXO temperature characteristic, the VCXO frequency error as a function of temperature, exhibits large frequency error swings that can be approximated by a third order polynomial. That is, for temperature T, and nominal temperature T0, The frequency error f can be approximated as $$f=p(T-T0)=a0+a1(T-T0)+a2(T-T0)^2+a3(T-T0)^3$$

where typically the first two terms of the polynomial p dominate except for large deviations of temperature from nominal temperature T0 by greater than +/−25 deg. C. For small temperature changes, the change in VCXO frequency can be approximated by the slope of the polynomial temperature characteristic p. Under dynamic temperature conditions the VCXO temperature varies slowly and approximately linearly so that the VCXO frequency change in dynamic temperature conditions can be approximated by a ramp in frequency over any time interval comparable to the AFC loop time constant. Therefore, as is known to those of ordinary skill in tracking loop design a Type 2 or higher order AFC loop is very effective in accurately tracking out ramp frequency perturbations caused by dynamic VCXO temperature conditions.

Another method for VCXO temperature compensation is software temperature compensation wherein the compensation algorithm runs in a general purpose processor such as a DSP or microcontroller. A circuit with a temperature sensor such as a diode or thermistor generates a voltage that is a known function of temperature. An analog-to-digital converter (ADC) converts the sensor voltage to a digital value held in the ADC register according to a known ADC conversion rule. The processor then reads the ADC register and translates the digital ADC reading to temperature by the known temperature sensor characteristic and ADC conversion characteristic for example by means of a lookup table in processor memory. The calculated temperature is then converted to a compensating VCXO DAC digital increment by means of a lookup table or polynomial that represents the inverse of the VCXO temperature characteristic. The compensating digital increment is then added to the nominal VCXO control signal. Software temperature compensation is often attractive in systems where the processor is available at no additional cost for temperature compensation because the processor is already present to perform other functions for the local unit. In track mode a drawback to software temperature compensation is that a sensor having sufficient accuracy to provide the fine frequency quantization error needed in tracking mode is a major cost component and a temperature sensor ADC with a very high resolution of approximately 16 bits is needed. However, coarse software temperature compensation in acquisition mode is a useful and cost effective method of reducing VCXO frequency error in acquisition mode.

A Doppler shift due to changing range between local unit and remote unit may also contribute to radio frequency errors. With the conventional AFC loop where the frequency error estimates are based on the received signal the AFC loop tracks the received signal so that the receiver frequency error is driven to zero but the resultant transmitter frequency error will be twice the Doppler shift. For systems where the Doppler shift is significant provisions are typically provided for measurement of the frequency error of the received signal at the remote unit and for transmission of a correction command to the local unit. The local unit then responds by adjustment of the local unit transmission frequency to null the measured Doppler error.

In U.S. Pat. No. 5,542,095 by Petranovich, a system for frequency tracking is described that utilizes the conventional methodology in which a nonlinear AFC algorithm obtains estimated receiver frequency error and controls the VCXO control voltage by means of a nonlinear feedback control signal. Petranovich does not mention ramifications of VCXO frequency quantization errors. However, Petranovich's disclosure does acknowledge the possible occurrence of signal distortions or switching noise caused when the VCXO ADC command changes value. One object of Petranovich's invention is restriction of the updating of the VCXO frequency only to intervals between telephone calls in order to avoid such signal distortions. A disadvantage of this strategy of fixing the VCXO ADC level during a call is that any VCXO frequency drift due to temperature change would not be tracked out by the AFC loop and could result in accrual of a very large frequency error that exceeds radio frequency error tolerances specified by regulatory rules. Temperature changes during a call may, for example, be caused by thermal flow on the printed circuit board from the power amplifier to the VCXO. During a call, say of duration 10 minutes, the frequency change of a VCXO in a radio-telephone can easily exceed the 0.1 ppm frequency tolerance allowed for example by the GSM specifications if the VCXO DAC is fixed during the call interval.

U.S. Pat. No. 5,740,525, Apr. 14, 1998, by J. H. Spears, utilizes a conventional AFC loop wherein the VCXO is controlled by a nonlinear AFC feedback algorithm to minimize receiver error during tracking mode. The Spears invention has no mention of the ramifications of VCXO DAC quantization error. The Spears invention provides for software temperature compensation in the initial acquisition phase to reduce large initial VCXO frequency error. In the tracking phase software compensation is not used, and the AFC algorithm steps the VCO in successive steps to reduce the frequency error to a predetermined magnitude.

SUMMARY OF THE INVENTION

Accordingly, a principal object of the invention is improvement in transmitter and receiver frequency control resolution in a track mode by use of complex digital phase rotators to serve as the primary means for fine uplink and downlink frequency control in an AFC loop in lieu of the conventional VCXO with DAC control. Significant advantage is thereby achieved relative to prior art in reduction of transmitter and receiver frequency error. The digital phase rotator performs successive complex phase rotations on digital signal samples at a uniform rotation rate to impart a desired frequency shift. A downlink phase rotator in the receiver path provides for fine adjustments to the receiver frequency, and an uplink phase rotator in the transmitter processing path provides for fine adjustments to the transmitter frequency. In a track mode the AFC feedback control signal based on measured receiver frequency error is applied as a frequency offset command to the downlink phase rotator to null receiver frequency error. The frequency offset command to the downlink phase rotator is scaled by an appropriate constant and applied to the uplink phase rotator as a transmitter frequency offset command to null the transmitter frequency error as well. In this way in track mode when radio communications between local and remote units may be operative the transmitter and receiver frequencies are corrected without incurring VCXO quantization errors stemming from VCXO DAC adjustments as in conventional AFC loops.

Importantly, the phase rotator method of frequency control of the invention provides for a much higher control precision and less frequency quantization error than is possible with a VCXO with DAC control. As a consequence the use of lower cost VCXO is facilitated. A complex phase rotator imparts a frequency shift to a sequence of complex phasors (inphase and quadrature samples) by rotating the phasors in the complex plane at a constant rate from sample to sample. The instantaneous frequency of the complex burst samples is the rate of phasor rotation. The phase rotator outputs contain phase quantization error but the error in frequency is relatively much smaller than the frequency quantization error of the VCXO with DAC control.

Moreover, the frequency error at the phase rotator output is random and has approximately zero mean so that frequency error due to phase rotator quantization can reduced to an arbitrarily small value by sufficiently long filtering or averaging in the AFC loop. In contrast in the case of VCXO frequency control, the VCXO frequency quantization error is a systematic bias error that cannot be reduced by averaging in the AFC loop. Moreover, the phase quantization noise at the phase rotator output can be maintained at a negligible level by modest output word size implementation. For example with just a 10-bit word size for inphase and quadrature components, the signal-to-quantization noise ratio of the phase rotator output is approximately 60 dB. A standard word size available in present-day low cost modern DSP is 16 bits so that a 10 bit word size is easily provided.

Another object of the invention is the minimization of receiver frequency error generally during a tracking mode when data communications transactions are conducted between the local unit and remote unit, and particularly in the presence of dynamic temperature conditions. The AFC provides for a linear Type 2 or higher order feedback control of the downlink phase rotator based on estimated receiver frequency error to null the receiver error. The Type 2 or higher order AFC control loop effectively nulls the ramp frequency errors induced by the VCXO temperature characteristic in a dynamic VCXO temperature environment. This is because temperature changes induce VCXO frequency errors that approximate a ramp over intervals of time of the order of tracking loop time constants. It is known to those of ordinary skill in the art that a Type 2 or higher order linear tracking loop ideally tracks ramp inputs with zero error. The use of a phase rotator for frequency control in the AFC loop during track mode in lieu of the VCXO normally used in a conventional AFC loop provides for more accurate frequency tracking in the dynamic temperature environment due to the absence of VCXO frequency quantization error. Further, an object of the invention is the minimization of transmitter frequency error in the tracking mode by appropriate frequency offset commands to the uplink phase rotator. The frequency offset of the uplink phase rotator is set equal to the offset of the downlink phase rotator multiplied by a scale factor. The scale factor is set approximately equal to the known ratio of the transmission channel frequency and the reception channel frequency. In this way the transmitter frequency error is also nulled by the AFC tracking loop if the Doppler shift is negligible. For systems where the doppler is non-negligible, the invention provides for the addition of a correction to the uplink phase rotator frequency offset to cancel the doppler error based on frequency error measurements received from the remote unit.

Yet another object is reduction of receiver frequency error at the start of a frequency acquisition mode by compensating for aging of the VCXO crystal and for VCXO temperature sensitivity. In this way the VCXO frequency error is substantially reduced so that frequency acquisition time is reduced, and use of a lower cost VCXO is supported. Compensation for crystal aging is achieved by the storage of a nominal VCXO DAC setting which is stored in non-volatile memory such as flash and retrieved and applied prior to frequency acquisition. At the end of acquisition mode the nominal VCXO DAC setting is updated to reflect the effects aging in the interval since the last time that the local unit was powered up. Compensation for temperature sensitivity is achieved by software temperature compensation.

In the preferred embodiment the AFC algorithm adjusts the VCXO frequency via the VCXO DAC only in a preliminary acquisition mode prior to data communications. Thereafter, during track mode when radio communication may occur between local unit and remote unit fine frequency adjustments are applied to transmitter and receiver by respective phase rotators and the VCXO DAC command remains fixed. However, in an alternative embodiment, an object of the invention is allowance for VCXO frequency adjustments in track mode in order to confine the allowable downlink phase rotator frequency offset to a predetermined limiting range +/−L while mitigating the effects of resultant VCXO frequency quantization error. Whenever the frequency offset of the downlink rotator exceeds the predetermined range, the AFC adjusts the VCXO DAC one LSB at a time in a direction that brings the frequency offset back into range. However, two constraints are placed on the VCXO frequency adjustment during track mode. First, each VCXO adjustment is scheduled to occur only during intervals when no radio communication between the local and remote units are to occur. Second, when the VCXO adjustment is applied to the VCXO DAC, simultaneously, adjustments to the downlink and uplink phase rotator commands are applied wherein the adjustments are calculated such that the phase rotator adjustments cancel the step change in transmitter and receiver frequencies resulting from the VCXO frequency adjustment. In this way VCXO frequency quantization errors are substantially mitigated. When phase rotator frequency offset magnitudes exceed some limit, unacceptable signal distortions caused by excessive deviation of signal carrier frequencies from the center of filter passbands can occur in the transmitter or receiver processing paths. An advantage of this alternative embodiment is that by limiting the range of frequency offsets in the phase rotators, signal distortions caused by excessive frequency offsets can be controlled and kept to acceptable levels. The alternative embodiment is useful for those systems utilizing lower cost VCXOs with larger temperature sensitivities wherein the likelihood is higher for unacceptably large phase rotator frequency offsets.

These and other objects of the invention are achieved by the present invention which provides for a method and apparatus for improved radio frequency accuracy for the transmitter and receiver of a local radio communication unit such as a radiotelephone that is communicating with a remote unit such as a base station. The invention provides for fine frequency control of the transmitter and receiver frequency by means of phase rotators in an automatic frequency control (AFC) loop instead of the conventional means of control by VCXO frequency adjustment. The frequency quantization error in the AFC loop is thereby reduced and the receiver and transmitter accuracy greatly improved. The invention also advantageously provides for compensation mechanisms for VCXO temperature sensitivity and crystal aging thereby reducing initial VCXO frequency error in a preliminary frequency acquisition mode and reducing frequency acquisition time. The improvements of the invention provide for the use of a lower cost VCXO having larger frequency quantization error, worse temperature sensitivity and larger drift rate from aging.

DETAILED DESCRIPTION OF THE PREFERRED EMBODIMENTS

Figure 1:
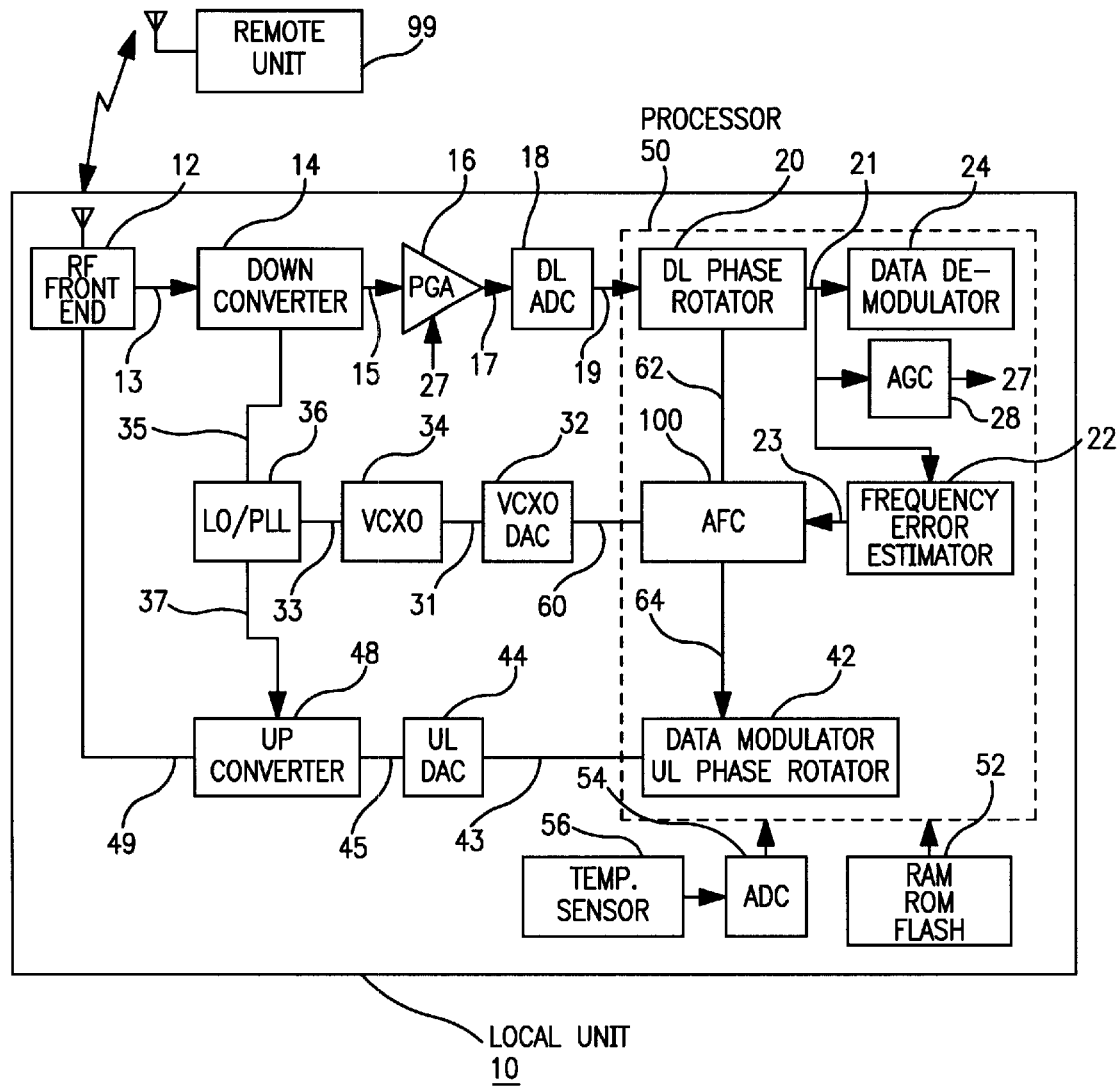
FIG. 1 is a block diagram showing a functional overview of the invention.

FIG. 1 shows a block diagram illustrating the preferred embodiment of the present invention. A local communication unit 10 such as a radiotelephone communicates with a remote communication unit 99 such as a cellular phone base station. In the preferred embodiment the local unit and the remote unit adhere to the Global System for Mobile communications (GSM) standard as an illustrative example. However, the invention is not restricted to the GSM standard and applies more generally to any system in which local unit derives its transmitter and receiver frequency by frequency tracking of radio transmissions from the remote station. Therefore, in FIG. 1 on the downlink transmission from remote to local unit, the radio frequency is one of a plurality of GSM channels allocated in the 935 to 960 MHz frequency band with a channel spacing of 200 KHz. On the uplink transmission from local to remote unit, the radio frequency is one of a plurality of GSM physical channels allocated in the 890 to 915 MHz frequency band with a channel spacing of 200 KHz. For full duplex communications transaction such as a radiotelephone call between remote and local unit, a pair of channels, one downlink and one uplink, spaced 45 MHz apart, is used by the local unit in accordance with a channel assignment from the remote unit. The transmissions in both direction are time division multiplexed (TDM) with TDM slots of length 577 microsecond, where the slots are numbered consecutively with a modulus of 8 ( . . . 0,1,2,3, 4,5,6,7,0,1,2, . . . ). A TDM channel corresponds to all the slots of the same slot number so that there are 8 TDM channels per frequency channel. A channel assignment to a local unit therefore includes designation of the downlink and uplink radio frequency channel pair as well as the TDM slot number. For a given channel assignment the local unit receives bursts of data transmitted in the assigned downlink channel slots and transmits consecutive bursts of data in the assigned uplink channel slots. In each assigned slot a burst of 148 bits is transmitted at the GSM symbol or bit rate of 270.833 Kbps by GMSK digital data modulation onto the radio frequency carrier.

In FIG. 1 the local unit 10 includes a radio section comprising radio frequency (RF) front end 12, a frequency down converter 14, a frequency up converter 48, a local oscillator (LO)/synthesizer unit 36, a voltage-controlled crystal oscillator (VCXO) 34 with controlling digital-to-analog converter (VCXO DAC) 32, a pair (inphase and quadrature) of programmable gain amplifiers (PGA) 16, a pair (inphase and quadrature) of down-link analog-to-digital converter (DL ADC) 18, and an up-link pair (inphase and quadrature) of digital-to-analog converters (UL DAC) 44. The RF front end itself includes antenna and conventional components not shown in the Figure such as a diplexer, a power amplifier, a low noise amplifier, and RF filters. The local unit 10 also includes baseband processing functions preferably embodied as software programs that run on a general purpose fixed-point processor 50 such as a DSP. The baseband processing functions include a complex downlink (DL) phase rotator 20, a data demodulator 24, a frequency estimator 22, automatic gain control (AGC) 26, automatic frequency control (AFC) 100, and a data modulator 42 with an integrated uplink (UL) phase rotator. Supporting processor memory 52 for the processor 50 includes a nonvolatile read/write memory for storage of program memory such as Flash for the baseband processing functions and storage of selected processing parameters, and RAM. The local unit 10 also includes a temperature sensor 56 with a sensor ADC 54 for temperature reading by the processor 50.

In FIG. 1 for downlink communication the remote unit 99 transmits and a burst RF signal containing digital voice or data to the local unit 10 on an assigned downlink radio channel. The RF front end 12 receives the RF signal, performs detection and amplification by a low noise amplifier, and performs RF filtering. The resultant received RF burst 13 is downconverted in frequency to baseband by a quadrature downconverter 14 which provides complex (inphase and quadrature) baseband components 15. In the preferred embodiment direct down conversion is used wherein the LO/synthesizer unit 36 produces a downlink LO signal 35 with a frequency that is approximately equal to the frequency of the assigned downlink channel. Then the downconverter 14 mixes the local oscillator signal 35 with the received RF burst 13 to generate the complex analog baseband burst 15 with resultant carrier frequency that is approximately zero. A pair of programmable gain amplifiers (PGA) scale the respective analog burst components 15 by a factor determined by the AGC command 27 from the AGC function 26. The resultant complex baseband components 17 are converted to respective digital inphase I and quadrature Q samples 19 of the burst by respective pair of downlink ADC 18 at the conversion rate of one sample per GSM symbol or 270.833 KHz. The downlink ADC is preferably of sigma delta type including a band-limiting filter matched to the GMSK modulation with output I and Q samples 19 having 16-bit word sizes to meet GSM dynamic range requirements. The successive complex (I, Q) sample pairs of the burst sample sequence 19 are then digitally rotated in the complex plane by the downlink phase rotator 20 with a sample-to-sample phase rotation rate that is determined by the downlink frequency offset command 62 produced by the AFC 100. In this way the DL phase rotator 20 acts as a digital frequency shifter for the complex baseband received samples 19 with the purpose of removing receiver frequency error which would otherwise appear as a phase roll of the complex sample sequence of the baseband burst 21. The data demodulator 24 processes the phase-rotated baseband complex burst sample sequence 21 to extract the burst data. Further processing of demodulated data is performed by other functions such as deinterleaver/decoder which are not pertinent to the description of the invention and therefore neither shown in this disclosure nor discussed further. The frequency error of the samples at the demodulator input must be small enough to ensure accurate data demodulation. The frequency estimator also processes the phase rotated complex baseband sample sequence 21 to obtain one frequency error estimate 23 per burst for the AFC 100.

In FIG. 1 for uplink communication by the local unit 10 the digital data modulator 42 generates a burst of baseband complex (inphase and quadrature) digital samples 43 containing data to be transmitted on the next assigned uplink slot. In the preferred embodiment the data modulation is GMSK at the GSM specified symbol rate of 270.833 bits per second with N=16 complex samples per symbol at the digital modulator output 43. The burst sample sequence 43 at the modulator output contains a frequency shift per the frequency offset command 64 produced by the AFC 100. The frequency shift is produced by an uplink digital phase rotator which is integrated with the GSM data modulator 42 and causes the complex phase of successive modulator phasor outputs 43 to be rotated in the complex plane at a rate equal to the uplink frequency offset command 64. The modulation data is provided by the interleaver and encoder which are not pertinent to description of the invention and therefore neither shown in the figure nor discussed further. The complex components 43 at the data modulator output are next converted by the pair of uplink DACs 44 to an analog continuous-time baseband complex signal 45. The complex uplink DAC output 45 is translated up in frequency to approximately the RF frequency of the assigned transmission channel by the quadrature upconverter 48 by mixing with the uplink local oscillator signal 37. In the preferred embodiment direct upconversion is used. That is, the LO/synthesizer 36 generates an uplink local oscillator signal 37 with a frequency approximately equal to that of the assigned transmission channel. Then the quadrature upconverter 48 mixes the local oscillator signal with the analog uplink baseband complex signal 45 to obtain the radio frequency burst 49 at the assigned transmission channel frequency. Then, the RF burst 49 is amplified by power amplifier, filtered, and radiated out the antenna by the RF front end 12.

In FIG. 1 for the local unit 10 the transmitter frequency error is the defined as the difference between the frequency of the assigned transmission channel and the frequency of the transmitted RF burst 49. The receiver frequency error is defined as the frequency of the complex baseband phasors 21 at the demodulator input when the received RF signal 13 is at the assigned downlink frequency. The local oscillator signals 35 and 37 of the synthesizer 36 are phase locked to the VCXO reference signal 33. Conventionally the frequencies of the local oscillator signals 35 and 37 are such that the transmitter and receiver frequency errors are zero when the frequency of the VCXO signal 33 is at its specified reference frequency. Thus, as in prior art transmitter and receiver frequency error is dependent on the frequency error of the VCXO signal 33. VCXO frequency error is induced by various error sources in the VCXO 34 or its DAC 32. Errors in the VCXO are due primarily to temperature sensitivity of the VCXO and aging of the VCXO crystal. Frequency errors induced by the VCXO DAC include DAC quantization error and switching noise that may occur as the DAC changes from one discrete DAC level to another.

In the invention, the AFC 100 minimizes transmitter and receiver frequency error by controlling the VCXO frequency either via the digital VCO command 60 to the VCXO DAC 32, or to the phase rotators via frequency offset commands 62 for the downlink or 64 for the uplink. The AFC commands are based on estimates 23 of downlink frequency error, one estimate per burst. As is presently shown the downlink and uplink phase rotator method provides for a much finer frequency control mechanism for the transmitter and receiver with much less frequency error than is possible via conventional VCXO DAC control. The AFC algorithm of the invention is novel in using the finer frequency resolution of the downlink and uplink phase rotators to advantage as the primary means for frequency control, with the VCXO DAC command 60 used only when necessary as a coarse frequency adjustment. In this way the relatively large frequency errors caused by VCXO DAC quantization error of prior art is avoided.

Figure 2:
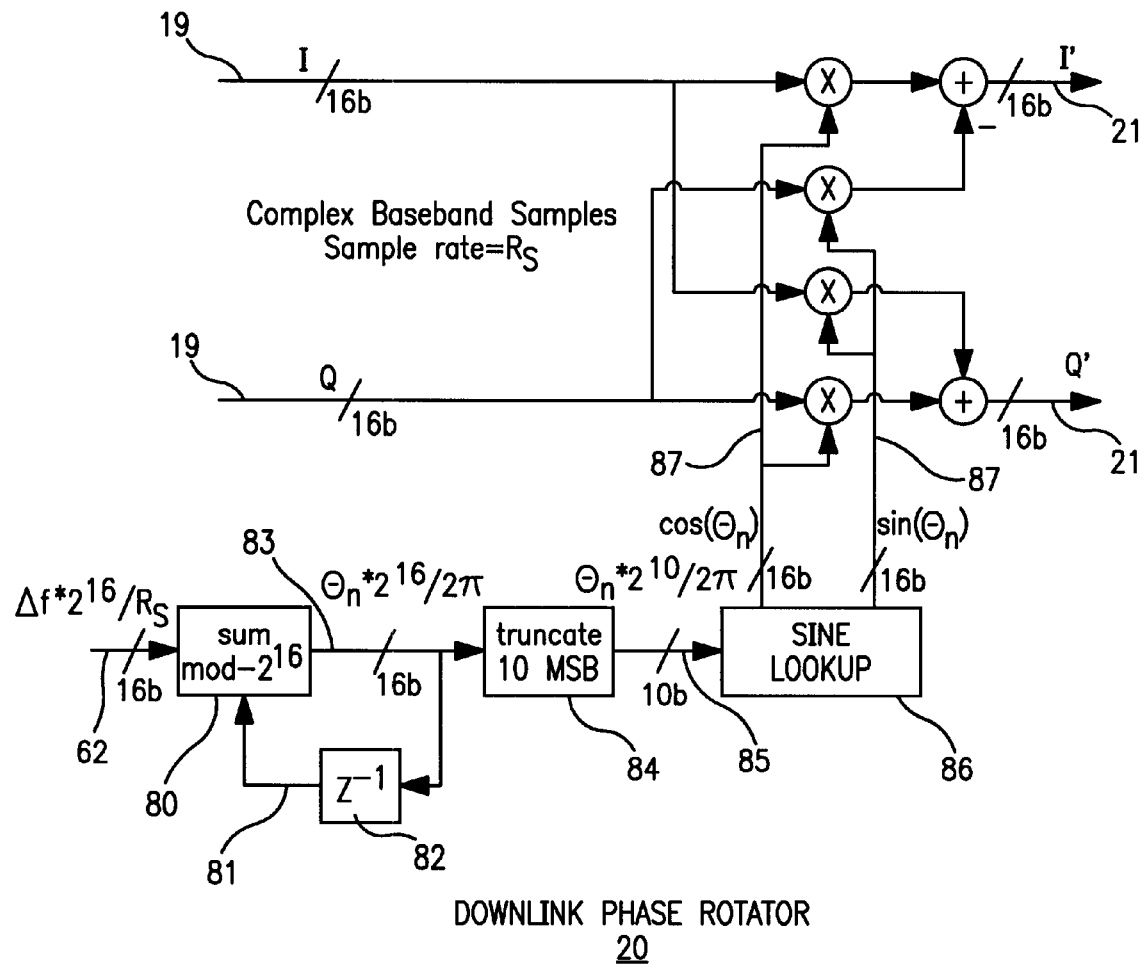
FIG. 2 is a block diagram giving a functional description of the downlink phase rotator in accordance with the invention.

FIG. 2 is a block diagram showing the preferred embodiment of the downlink digital phase rotator 20. Each complex (inphase and quadrature components) baseband digital sample 19 is rotated in the complex plane by complex multiplication with complex rotator vector 87 to obtain rotated complex output phasor 21. The complex rotator vector 87 has a real and an imaginary part that are equal respectively to the cosine and sine of the rotation angle $\theta_n$ for the n-th complex phasor. The sine and cosine values are read from a sine lookup table 86 having 256 entries of 16-bit sine values for rotation angles in the first quadrant. The input 85 to lookup table 86 is a 10-bit word representing the current rotation angle $\theta_n$ in radians modulo $2\pi$. The two most significant bits of the input word determine the quadrant of the rotation angle, and the eight least significant bits determine the table lookup address. For a commanded downlink frequency offset $\Delta f$ the rotation angle increases at a constant rate per sample interval and this monotonically changing phase angle $\theta_n$ is represented by a modulo-$2^{16}$ accumulator with adder 80 and delay element 82. The input to the phase accumulator 80 is a 16-bit word representing the normalized downlink frequency offset command $2^{16}\Delta f/R_s$, where $\Delta f$ is the downlink offset command in Hz, and $R_s$ is the GMSK symbol rate of 270.833 KHz. The frequency resolution of the downlink phase rotator 20 is 4.1 Hz for the 16-bit accumulator word size in the preferred embodiment. Finer resolution can be achieved if desired by simply increasing the word size of the accumulator 80 (for example, frequency resolution of 0.016 Hz for 24-bit word size). This is in contrast with the much larger 30 Hz resolution described earlier for the VCXO DAC method of frequency control for the case of 10 bit DAC and a high quality VCXO. An advantage of the phase rotator method of frequency control of the invention is that the frequency resolution is fixed and not dependent on the quality of the VCXO. In contrast with the conventional VCXO DAC method of frequency control a lower quality VCXO or VCXO crystal will generally exhibit larger frequency quantization error. Thus a further advantage of the invention is that generally the use of lower cost VCXO is possible using the downlink phase rotator for receiver frequency control for a given frequency error tolerance.

In FIG. 2 the 16-bit inphase and quadrature quantization error at the downlink phase rotator output is not a significant source of phase distortion or frequency error. In FIG. 2, the signal-to-quantization noise ratio is 96 dB for a full scale signal, and allowing for 10 dB AGC headroom and 28 dB signal multipath fade the signal-to-quantization noise ratio is still better than 58 dB during a signal fade. In FIG. 1, the AGC function 26 measures average signal amplitude in the baseband complex signal 21 and sets the gain of PGA 16 by means of AGC command 27 so that the average signal amplitude over many fades remains at approximately 10 dB below saturation, thereby maintaining the ADC resolution and associated signal to quantization noise ratio at an acceptable level. The preferred embodiment of the downlink phase rotator illustrated in FIG. 2 with the preceding phase and frequency error characteristics is easily implemented in a low cost 16-bit fixed point DSP.

Figure 3:
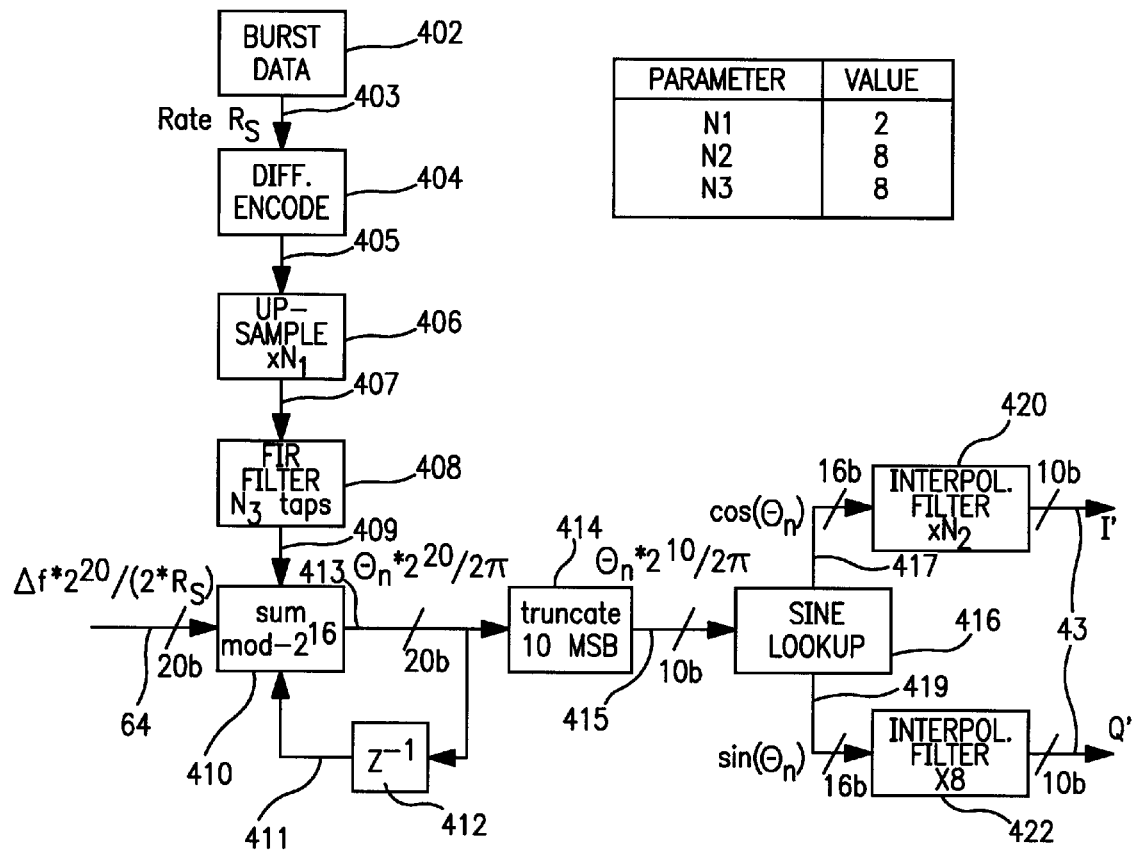
FIG. 3 is a block diagram giving a functional description of the preferred embodiment for a data modulator with an integrated uplink phase rotator for continuous phase modulation systems.

For most modulation types, a digital data modulator may be configured to generate a baseband complex output (inphase and quadrature outputs). In that case for fine uplink frequency control the downlink phase rotator design of FIG. 2 may also be used analogously for the uplink phase rotator to operate on the complex modulator output. Because there is no signal fading associated with the modulator output, the signal-to-quantization ratio is typically higher at the uplink rotator output for a given output word size. However, for the GSM standard of the preferred embodiment GMSK modulation is of the class of continuous phase modulation for which a simpler uplink phase rotator embodiment of FIG. 3 is specified wherein the phase rotator is an integral part of the continues phase data modulator. The configuration in FIG. 3 has the advantage that the modulator phase variable appears explicitly in the embodiment of continuous phase data modulator. Then phase rotation, or generation of a frequency offset simply involves addition of a constant to the modulation phase variable and complex multiplication operations normally required in the phase rotator are unnecessary. This results in a significant reduction in complexity for implementation of the uplink phase rotator.

In FIG. 3 the binary data for the next burst transmission is held in a buffer 402 and at the assigned time slot is output at the symbol rate $R_s$. The burst data is passed through a differential encoder 404 wherein the differential coded binary data output 405 with binary values 0 and 1 are is mapped into respective real values +/−1. Next, the differentially coded data 405 is upsampled by upsampler 406 by repetition N1=2 samples per bit, and then filtered by a pulse shaping FIR filter 408 having filter length N3 =8 bits. The output 409 of the pulse shaping filter represents filtered instantaneous modulation frequency which is added to the normalized frequency offset command 64 for uplink phase rotation. Both modulation frequency 409 and frequency offset command 64 are combined and converted to modulator phase by the integrator comprising a summer 410 and a delay element 412. The summer 410 is a modulus summer to reflect the cyclic nature of phase modulo-$2\pi$ and the modulus is selected to achieve desired frequency resolution for both modulation and uplink frequency shift corresponding to the commanded frequency offset 64 for the uplink phase rotator. For the preferred embodiment the phase modulus is $2^{20}$ corresponding to the selection of a 20 bit word for representation of normalized frequency offset 64, and frequency modulation 409. The 20-bit modulator phase is truncated to 10 bits as the sine lookup table input variable 415. The resultant cosine and sine values 417, 419 returned by the lookup table 416 represent modulator inphase and quadrature outputs respectively at the sample rate of N1 samples per modulation symbol. The lookup table contains 256 values of the sine function in the first quadrant and the table suffices for generation of both sine and cosine over all four quadrants, where the quadrant of the phase angle 415 is indicated by the two most significant bits. The modulator inphase and quadrature components are upsampled by a factor N2 by respective interpolation filters to minimize quantization error in the uplink DAC conversion 44 that follows. The resultant complex baseband modulator output components 43, which have a sample rate of Rs*N1*N2, or N1*N2 samples per symbol, are then processed by the pair of uplink DACs 44. The values for parameters N1, N2, and N3 indicated in the table in FIG. 3 for the preferred embodiment are suitable for the specifications of the GSM standard. For other systems which may employ other continuous phase modulation types other parameter values may be used as known to those of ordinary skill in the art.

The uplink frequency control resolution for the uplink phase rotator in FIG. 3 is 0.51 Hz. Any degree of finer resolution can be achieved by simply increasing the word size of the frequency variables 64, 409, and 413. This is in contrast with the much poorer 30 Hz resolution described earlier for VCXO DAC frequency control for the high quality VCXO with 10-bit DAC. Further, as in the case of the downlink phase rotator an advantage of the method of frequency control by uplink phase rotator in the invention is that the frequency resolution is fixed and not dependent on the quality of the VCXO. In contrast with the conventional VCXO DAC method of frequency control a lower quality VCXO or VCXO crystal will generally exhibit larger frequency quantization error. Thus a further advantage of the invention is that the use of lower cost VCXO is facilitated by the method of frequency control by phase rotators in the invention.

In FIG. 1 the LO/synthesizer produces the local oscillator signals 35 and 37 for the downconverter and upconverter respectively by means such as in Ref. [3] known to those of ordinary skill in the art. The LO synthesizer is comprised typically of voltage controlled oscillators and synthesizers wherein the VCO's generate nominal uplink and downlink local oscillator frequencies, and the synthesizers generate small frequency offsets for tuning of local oscillators to the assigned channel frequencies. When the VCXO is operating at its specified reference frequency exactly, for example 13 MHz as is commonly used for GSM, the local oscillator signals operate at their nominal frequencies wherein transmitter and receiver frequency errors are zero. This is the desired state of operation which enables the demodulator 24 of the local unit and demodulator of the remote unit 99 to demodulate respective downlink and uplink data with acceptable error rate and the transmitter frequency to meet regulatory specifications. However, the VCXO frequency generally deviates from its specified reference frequency due to various error sources. The dominant sources of VCXO frequency error induced within the VCXO itself are temperature sensitivity and crystal aging. Sources of error due to the VCXO DAC are quantization error and switching transients. Lower cost VCXOs tend to exhibit larger frequency errors. One purpose of the AFC 100 is to minimize transmitter and receiver frequency error caused by all sources of VCXO reference frequency errors. The invention provides for two ways to control for transmitter and receiver frequency: (1) conventional VCXO frequency adjustment by VCXO DAC command 60, (2) frequency shifting by phase rotators for the receiver by downlink frequency offset command 62 and for the transmitter by uplink frequency offset command 64. The AFC algorithm 100 of the invention uses the VCXO control 60 only for coarse frequency control, and uses phase rotator commands 62 and 64 as its primary fine frequency control mechanism to compensate the sources of error. In contrast conventional AFC algorithms typically utilize the VCXO DAC as its sole means of transmitter and receiver frequency error control. The use of phase rotators as the primary means of fine frequency control by the invention facilitates the use of lower cost VCXOs.

In FIG. 1 the AFC 100 is preferably executed by a general purpose processor 50 such as a DSP and with program stored in memory 52. An overview of the AFC algorithm is as follows: There are two AFC modes: (1) frequency acquisition mode, and (2) frequency track mode. At power on of the local unit, transmission of the local unit 10 to the remote unit 99 is inhibited as a default condition. Acquisition mode which begins at power on involves the signal processing of received bursts from the remote unit and adjustment of frequency solely by VCXO DAC command. During acquisition mode the downlink and uplink phase rotator offset frequency commands 62 and 64 set to zero. As an initial frequency adjustment the AFC produces a VCXO nominal frequency command 60 for the VCXO DAC for nominal temperature T0=25 deg C. To account for temperature sensitivity, the AFC obtains a measurement of the current temperature T by reading the thermal sensor ADC 54. Based on the temperature differential T−T0 a lookup table describing the VCXO temperature sensitivity table is entered and an incremental adjustment for VCXO command is returned for compensating for temperature deviation from nominal temperature. The incremental adjustment for temperature is added to the nominal frequency command and applied to the VCXO DAC. In this way the AFC compensates for VCXO temperature sensitivity during acquisition mode. Subsequently, the AFC makes two more VCXO frequency adjustments to VCXO command 60, a coarse frequency adjustment followed by a fine frequency adjustment. The frequency adjustments are based on frequency error estimates 22 obtained by received burst processing by the frequency error estimator 22. Then successful acquisition is verified by successful demodulation of a burst of data. After verification of successful acquisition, track mode commences wherein the VCXO command 60 is fixed, and thereafter the AFC exercises frequency adjustments only by frequency offset commands 62 to the downlink phase rotator and 64 to the uplink phase rotator. AFC updates of frequency offset commands are generated by Type 2 feedback loop controller based on successive updates of frequency error estimates. Two-way data communications of local unit with the remote unit is enabled only during Track Mode when the improved frequency error performance by the phase rotators is in effect. In the preferred embodiment frequency error during track mode meets the GSM specified frequency error tolerance of 0.1 ppm.

Figure 4:
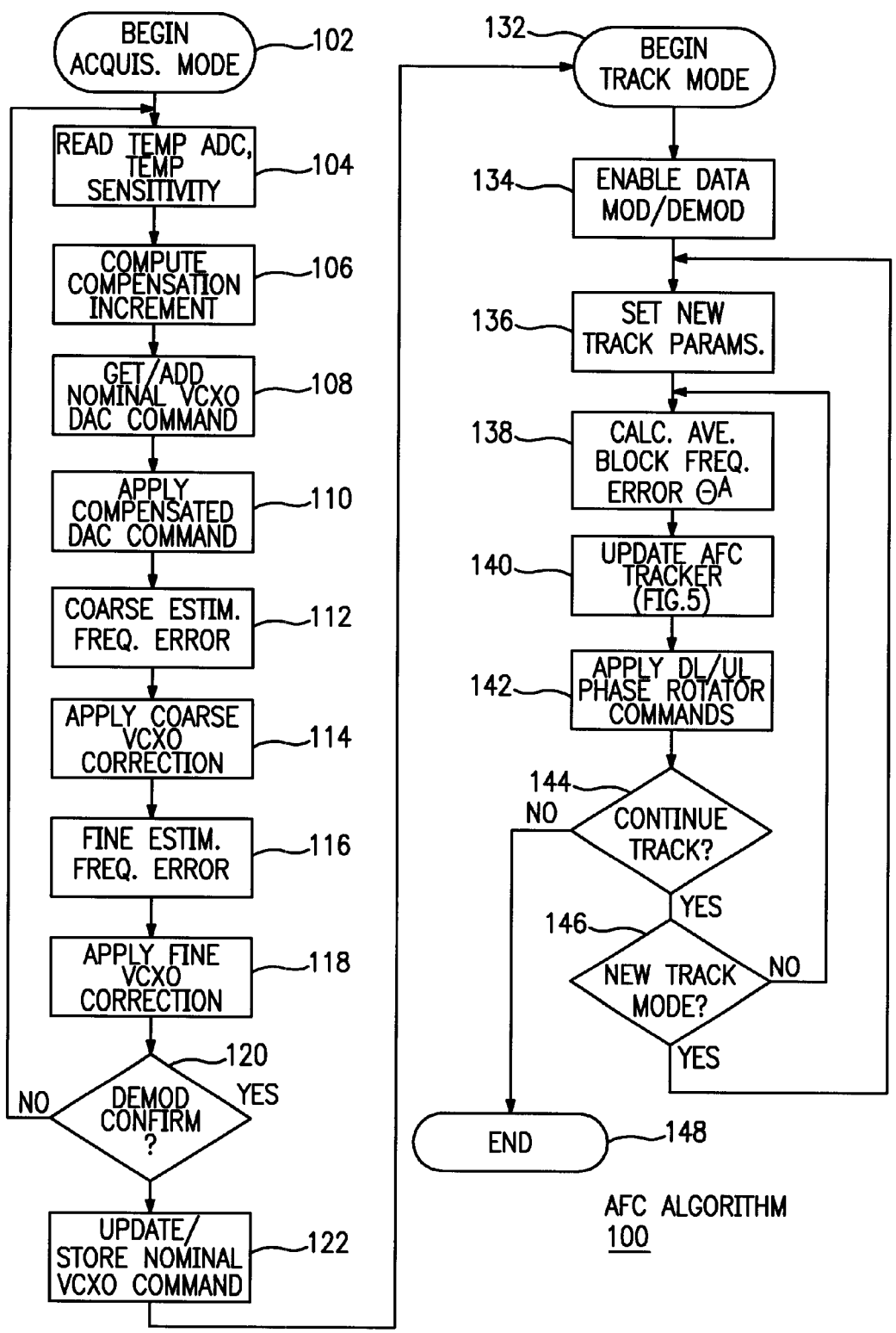
FIG. 4 is a flow diagram describing the preferred embodiment for the automatic frequency control (AFC) function.

FIG. 4 illustrates a flow diagram for the preferred embodiment of the AFC algorithm 100 for correction of receiver and transmitter frequency error according to the invention. The AFC algorithm begins with start of acquisition at step 102 shortly after power on of the local unit or loss of signal. At step 104 the AFC reads the register of the temperature sensor ADC 54. The resultant differential temperature T−T0 relative to nominal temperature T0=25 deg C., is then entered into a VCXO temperature sensitivity function which returns a frequency differential $\Delta f$. The temperature sensitivity function may be represented by a mathematical expression such as a polynomial, or more generally by a lookup table. For the preferred embodiment the temperature sensitivity function is represented by a third order polynomial as follows:

$$\Delta f = a0 + a1(T-T0) + a3(T-T0)^3 \text{ (step 104)}$$

The polynomial coefficients a0, a1, and a3 which are supplied by the VCXO or crystal vendors are loaded into the nonvolatile memory 52 during factory calibration of the local unit 10. The temperature sensitivity function $\Delta F$ is expressed in parts per million (ppm) and in step 106 is next converted to incremental VCXO DAC units (LSBS) by the relation $$\Delta V = -a(\Delta f) \text{ (step 106)}$$

where the coefficient a is the DAC characteristic slope in units of DAC LSBs per ppm. The DAC characteristic slope is actually a joint characteristic of both the DAC and VCXO, and is measured in each local unit during factory calibration and written to nonvolatile memory. At step 108 the nominal DAC command V0 which nominally sets the VCXO frequency to its specified frequency at nominal temperature is retrieved from non-volatile memory and added to the temperature compensation increment $\Delta V$, and the resultant sum V1 is applied at step 110 to the VCXO DAC as the compensated VCXO DAC frequency command.

$$V1 = V0 + \Delta V \text{ (step 110)}$$

In this way the temperature sensitivity of the VCXO is compensated at the outset of acquisition mode. For VCXO DAC command V1, a coarse frequency error estimate Δf1 is computed by the frequency error estimator 22 based on the processing of the baseband digital received burst samples 21. In the preferred embodiment the received burst is the GSM FCCH burst which is a tone signal periodically transmitted in a slot of a control channel by the GSM base station to aid frequency estimation by local units. The coarse frequency error estimate is converted to a correction value ΔV1 in VCXO DAC command units and applied at step 114 as a correction to the updated VCXO DAC command.

$$\Delta V1 = -a(\Delta f1)$$

$$V2 = V1 + \Delta V1 \text{ (step 114)}$$

Next at the VCXO command V2, a fine receiver frequency error estimate Δf2 is provided at step 116 by the frequency estimator, again based on the processing of an FCCH burst. This second frequency error estimate is more accurate than the preceding coarse frequency error estimate because better time-of-arrival estimate for the FCCH burst is available for the second estimation, where less time uncertainty implies more accurate frequency error estimate. The methodology for computation of receiver frequency error estimates as required for the invention are conventional and well known to those of ordinary skill in the art as in Ref. [4] and therefore not described in detail here. Conventional synchronization techniques are also sufficient for the local unit so that no further discussion about time acquisition or time tracking is provided in this disclosure. The fine frequency error estimate Δf2 is next converted to a VCXO DAC correction value ΔV2 and applied as a correction to the current DAC ADC command V2 at step 118 to remove the remaining downlink frequency error:

$$\Delta V2 = -a(\Delta f2)$$

$$V3 = V2 - \Delta V2 \text{ (step 118)}$$

At step 120, data is demodulated to confirm that the frequency acquisition has been successful, i.e. that receiver frequency error is small enough for data demodulation. For the preferred embodiment for GSM the so-called SCH burst in the same control channel as the FCCH burst contains data and a cyclic redundancy code (CRC). The criterion for successful frequency acquisition is error-free demodulation of the SCH burst as indicated by the CRC parity check. In the case CRC indicates failure the AFC algorithm restarts acquisition mode at step 104. In the case CRC indicates success the AFC algorithm transitions to track mode. Prior to transition, the value of V0 which sets the VCXO frequency to its specified frequency at nominal temperature is updated and stored, where the update is given by the relation $$V0(\text{updated}) = V0(\text{old}) + b^* \text{sign}\{\Delta V1 + \Delta V2\}$$

That is, the coarse and fine VCXO DAC corrections during acquisition are added and the polarity of the total correction is used to update V0 an increment b units in the direction of the total correction. The preferred value of parameter b is one DAC LSB. In this way the nominal VCXO setting is continually updated for aging each time the local unit is powered on.

After transition to track mode at step 132, two-way communications between local unit 10 and the remote unit 99, i.e., data demodulation and data modulation, is enabled at step 134, and the track mode parameters are initialized at step 136. The track mode parameters are summarized in the Track Parameter table in FIG. 5. During track mode a sequence 23 of fine frequency error estimates e(0), e(1), . . . are calculated by the frequency error estimator 22, where each estimate is an average over a received burst. An average frequency error estimate ê is obtained in step 138 by averaging the next N burst error estimates e(1), e(2), . . . ,e(N), that is, $$\hat{e}(1) = [e(1) + e(2) + \ldots + e(N)]/N \text{ (step 138)}$$

Figure 5:
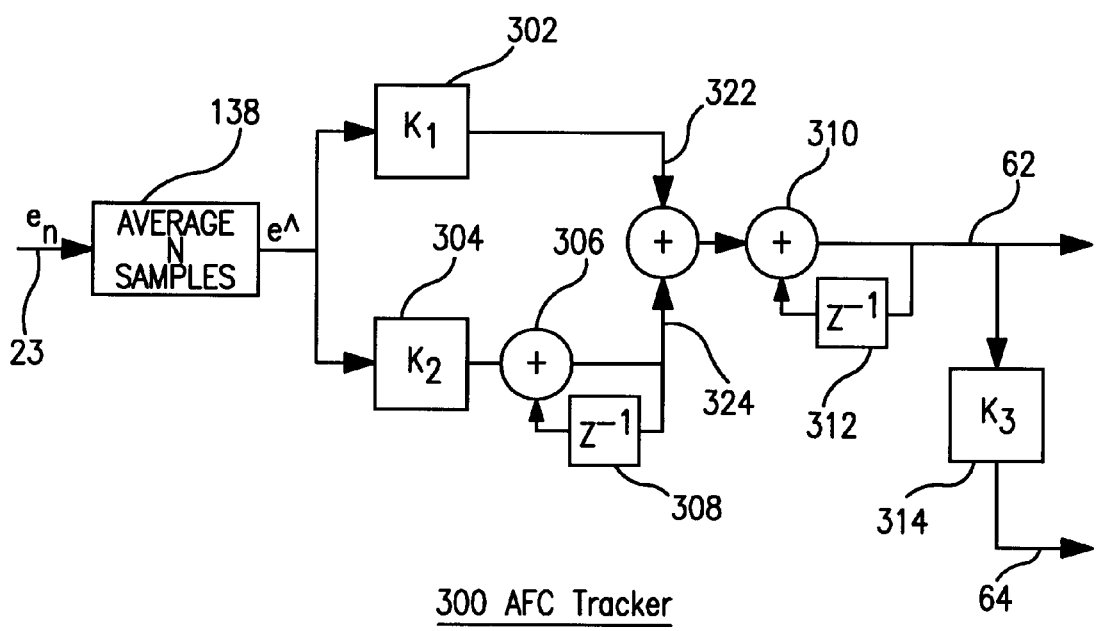
FIG. 5 is a block diagram describing details of the AFC function computation of frequency offset commands for the downlink and uplink phase rotators in a track mode.

The block average is used at step 140 as an input to update the AFC Tracker shown in FIG. 5, where each update generates a pair of downlink and uplink phase rotator frequency offset commands 62 and 64 which are then applied at step 142 to respective rotators. Referring back to FIG. 4, the AFC algorithm next makes a decision at step 144 to either terminate track mode because of either loss of signal or because the local unit is to be powered off, or otherwise continue with processing of the next block of frequency error estimates. Monitoring for loss of signal is performed by conventional means known to those skilled in the art. If the decision is to continue, the AFC next determines at step 146 if new tracking parameters are needed. If new tracking parameters of FIG. 5 are needed the AFC algorithm jumps to step 136 where the track mode parameters are changed; otherwise, the preceding algorithm steps are repeated starting at step 138 without changing of track mode parameters. For the preferred embodiment for GSM, track mode has three submodes wherein each submode utilizes a different set of track parameter values as summarized in the Parameter Table in FIG. 5. The submodes are: (1) active mode such as during a phone call, (2) standby mode wherein only paging messages are received intermittently, and (3) control mode during call setup communication with the base station. The number N of burst frequency error estimates that are averaged for a frequency tracker update as well as tracker loop gains K1 and K2 differ for the submodes.

FIG. 5 shows a block diagram for the AFC Tracker which produces a sequence of frequency offset commands for the downlink and uplink phase rotators in a Type 2 AFC tracking loop configuration. The AFC Tracker is updated in step 140 of the AFC algorithm of FIG. 4. The AFC Tracker input 23 is the sequence of burst frequency error estimates 23 in units of Hz from the frequency error estimator 22. An averaging operation 138 over N such burst estimates provides an average estimate ê in Hz for AFC Tracker update. After N burst estimates, the average ê is used to update the AFC Tracker state in accordance with FIG. 5. The gains K1 302 and K2 304 represent the loop gains, and K3 314 is the ratio of uplink to downlink channel frequencies. The $z^{-1}$ operators 308, 312 denote delay operators. The AFC output 62 is the updated downlink frequency offset command sent to the downlink phase rotator to correct receiver frequency error. The AFC output 64 is the updated uplink frequency offset command sent to the uplink phase rotator to correct transmitter frequency error. The constant K3 is ideally equal to the ratio of uplink to downlink channel frequencies but the single value for K3 shown in the AFC Parameter Table in FIG. 5 may be used as an approximation for all transmission/reception channel pairs of the GSM system. As is known to those of ordinary skill in the art the second order loop gains K1 and K2 uniquely specify the bandwidth and damping ratio of the AFC tracking loop, or conversely the loop bandwidth and damping ratio uniquely define the gains K1 and K2. The summer 310 and delay element 312 together form an integrator, and the summer 306 and delay element 308 form the second integrator. The gain values K1 and K2 specified in FIG. 5 provide for a damping ratio of 0.707, and a loop bandwidth that depends on the tracking submode.

In track mode the AFC loop of the invention utilizes phase rotators for the primary means of frequency control instead of VCXO voltage control as in prior art. Consequently the frequency tracking loop has less quantization error than prior art due to the much smaller frequency quantization errors possible with phase rotators over VCXO controllers. A further advantage is that the smaller frequency quantization error of the phase rotators enhances the AFC tracking loop performance in nulling frequency tracking errors due to VCXO temperature sensitivity in a dynamic temperature environment. As described earlier the temperature sensitivity characteristic of a VCXO can be represented by a smooth polynomial function so that the rate of change of VCXO frequency with temperature is approximately equal to the slope of the polynomial curve for small changes in temperature. Since the temperature change is also a smooth slowly varying function of time, the effects of changing temperature on VCXO frequency can be approximately modeled as a ramp frequency error input to the AFC loop with a slope equal to the product of the slopes of temperature change frequency sensitivity curves. As is well known to those of ordinary skill in the art a ramp input to the Type 2 AFC loop of the invention is theoretically tracked out with zero error according to the linear theory of control. Therefore, the Type 2 AFC tracking loop configuration of the invention using the phase rotators as the means of frequency control is well suited for changing frequency control in dynamic temperature environments. In contrast, with the conventional VCXO voltage control method of frequency control associated large quantization errors and switching transients require substantial filtering which impairs the ability of the Type 2 loop to track rapidly changing frequency inputs caused by temperature variation. Accurate frequency tracking under dynamic temperature conditions is particularly important in smaller local units such as modern compact cellular phone handsets wherein the closer proximity of power amplifiers to the VCXO cause higher rates of change of VCXO temperature. During a telephone conversation the power amplifier dissipates substantial thermal energy in the local unit which leads to rapid rates of change of VCXO temperature.

In the preferred embodiment of the AFC algorithm 100 the VCXO ADC command 60 is fixed during track mode so that the large frequency quantization error associated with VCXO ADC control is avoided and frequency corrections are applied only by the downlink and uplink phase rotators having very fine frequency control resolution. In an alternative AFC algorithm, occasional VCXO adjustments are permitted by addition of the subroutine shown in FIG. 6 to limit the maximum frequency offset command of the downlink phase rotator within a range +/−L. Such limiting of the frequency offset range may be useful for example in cases where the receiver band limiting filter precedes the downlink phase rotator in the receiver. In that case the carrier frequency of the received signal is off filter center by an amount less than L. By setting offset limits, signal distortions associated with off-center filtering operation are controllable. Similarly off-center filtering in the transmitter are also controlled. The alternative embodiment of the AFC algorithm is the same as the preferred embodiment illustrated in FIG. 4 with the addition of the optional track mode VCXO adjustment subroutine illustrated in FIG. 6. Whenever a track mode update of a downlink phase rotator offset occurs, the VCXO adjustment subroutine is called for possible VCXO DAC frequency adjustment. If the downlink frequency offset exceeds the permissible range the VCXO command is adjusted to reduce the downlink frequency offset magnitude, where the adjustment is limited to one LSB unit of the VCXO DAC. Simultaneous with the VCXO frequency adjustment, the DL and UL phase rotator frequency commands are adjusted to substantially cancel the step VCXO frequency change. That is, the simultaneous downlink and uplink phase rotator frequency adjustments are approximately equal to but of opposite polarity relative to the respective jump in receiver and transmitter frequency caused by the VCXO DAC adjustment.

Figure 6:
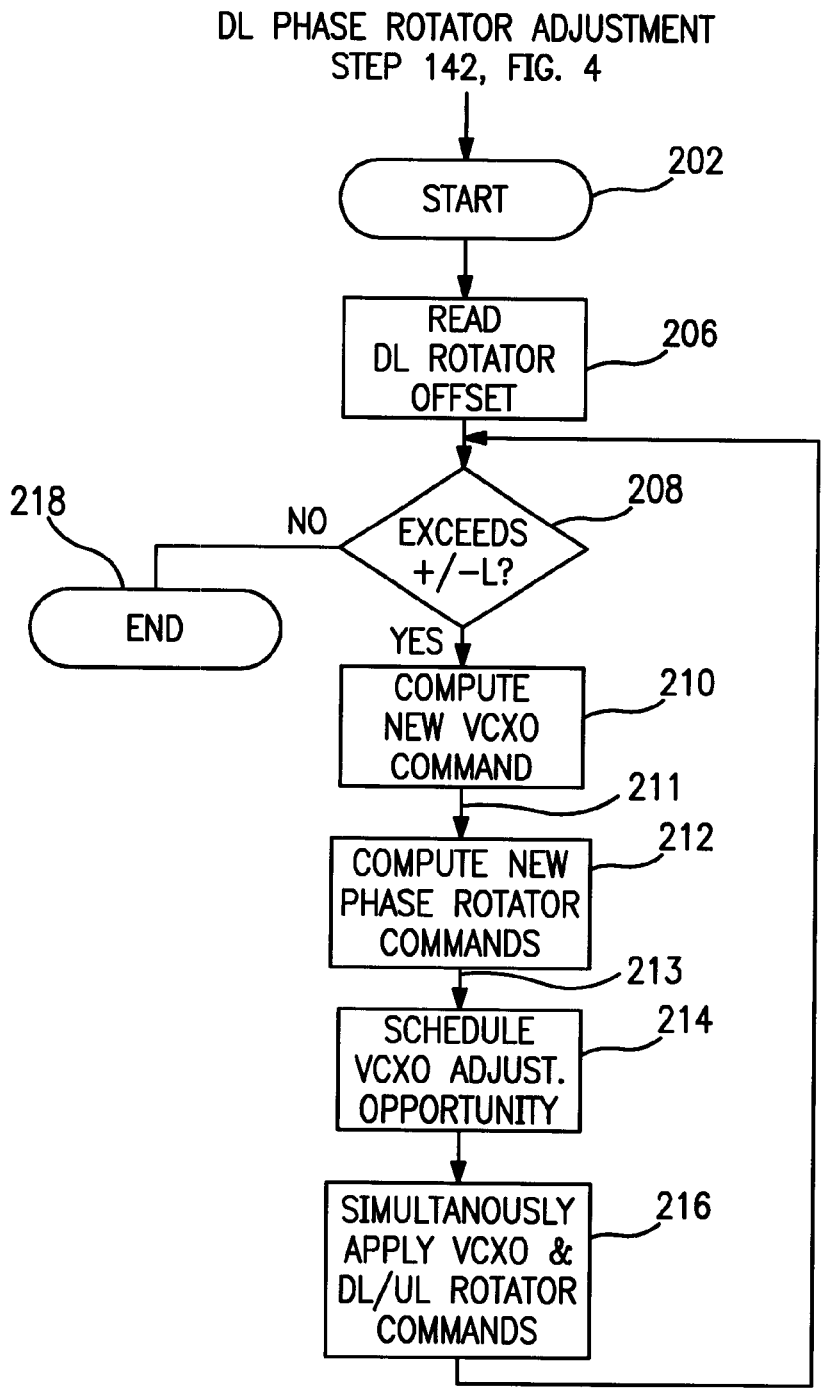
FIG. 6 is a flow diagram describing a subroutine addition to the AFC function of FIG. 4 wherein FIGS. 4 and 6 together describe an alternative embodiment of the AFC function.

FIG. 6 illustrates a flow diagram for the additional AFC procedures 200 for an alternative AFC embodiment. After UL and DL phase rotator adjustment at step 142 in FIG. 4 for the preferred embodiment of the AFC algorithm the VCXO adjustment subroutine of FIG. 6 is initiated at step 202. The current downlink phase rotator frequency offset is read at step 206 and tested if the reading is in the permissible range +/−L at step 208. If the offset is within the permissible range the subroutine ends. Otherwise, a new VCXO DAC command 60 is calculated at step 212 which is the old command plus or minus one DAC LSB, whichever reduces the DL phase rotator offset magnitude. Then at step 212 a new DL phase rotator and UL phase rotator frequency offset commands 62, 64 are computed wherein the increments of the new phase rotator commands produce receiver and transmitter frequency increments that are equal in magnitude and of opposite polarity relative to the frequency shifts caused by the VCXO frequency adjustment computed at step 210. That is, the computed phase rotator increments cancel the effects of the change in transmitter and receiver frequencies caused by the VCXO frequency adjustment. Calculation of the phase rotator increments is possible because the VCXO/DAC characteristic slope in units of Hz per LSB is known from factory calibration of each local unit as described earlier. Then an opportunity for simultaneous application of the new VCXO DAC frequency adjustment and new phase rotator frequency offset adjustments are scheduled at step 214, and then applied at the scheduled time at step 216. The VCXO adjustments are scheduled to occur at a time when neither transmission nor reception of data is occurring in the local unit 10. In this way VCXO adjustments occur when VCXO DAC switching noise and transients have minimal effect on frequency tracking error. In TDMA systems such as GSM, the VCXO adjustment opportunities are made to occur between calls or in TDMA slots when the local unit 10 is assigned neither transmission nor reception duties. In a CDMA system where transmissions and receptions are continuous during a call the VCXO adjustments are scheduled between phone calls or between message exchanges in a data mode. In step 216 because the downlink and uplink phase rotator frequency adjustments substantially cancel the frequency step associated with the VCXO adjustment the residual frequency tracking error is significantly reduced relative to prior art.

The alternative AFC embodiment of FIG. 6 adjusts VCXO frequency only when the frequency offset 62 of the DL phase rotator exceeds a predetermined frequency range +/−L. The frequency range +/−L represents a hysteresis region wherein no adjustment of the VCXO occurs. When the magnitude of the DL phase rotator frequency offset 62 wanders outside the boundaries of the hysteresis range, the VCXO control signal is adjusted at step 216 to bring the offset back within the boundaries of the normal operating range, and no further. The simultaneous application of the new DL phase rotator offset 62 at step 218 aids the AFC tracking loop by canceling the effects of the update such that substantially no additional tracking error is added to the AFC tracking loop due to the VCXO frequency adjustment. This implies that substantially no perturbation in the frequency of the RF transmission signal 49 results from the VCXO frequency adjustment either. The VCXO control method of FIG. 6 thereby serves to maintain the DL frequency offset within specified operating limits. The scheduling of VCXO corrections at step 214 provides for means to control the timing of corrections to occur when possible spurious signals due to VCXO DAC level changes have little or no effect on communications performance.

The need for VCXO corrections diminishes as the value of the hysteresis limit L increases, and therefore the largest acceptable value of the limit parameter L is desirable for a given system. The largest tolerable value of L is determined by the specifics of the system and the configuration of the local unit 10 processing. One constraining factor is signal distortion caused by frequency offset of the received signal from the center of receiver and transmitter filters. This filter offset effect is most critical in the band limiting filters of the transmitter and receiver. For example in the GSM preferred embodiment in FIG. 1, the receiver band-limiting filter is at baseband in front of the downlink phase rotator and with a one-sided bandwidth of approximately 100 KHz. The maximum tolerable distortion for off-center filtering A frequency offset of up to approximately 5% from the filter center can be tolerated for GSM. For this example a hysteresis limit of approximately 5 KHz equal to 5% of 100 KHz can be tolerated in the VCXO adjustment algorithm. That is the hysteresis limit can be set to L=+/−5 KHz or larger than +/−5 ppm for the 900 MHz operating frequency of GSM. The temperature sensitivity of a standard VCXO for GSM local units is +/−2.5 ppm so that the VCXO frequency error is highly unlikely in this example to exceed the hysteresis limit L and require VCXO adjustment. However, for lower cost VCXO with worse temperature sensitivity the hysteresis limit L may be occasionally exceeded and trigger an adjustment to the VCXO DAC in accordance with the subroutine of FIG. 6. During such VCXO corrections perturbations to frequency tracking are minimized by the joint application of phase rotator frequency offsets that cancel the effects of the jump in VCXO frequency caused by DAC quantization.

Thus the present invention provides means for improved transmitter and receiver frequency accuracy in a local unit that communicates with a remote unit. As a further benefit the invention facilitates the use of a lower cost VCXO for generation of the local unit reference frequency. While the above description contains many specificities, in particular the preferred embodiment adhering to the GSM standard for cellular telephony, these should not be construed as a limitation on the scope of the invention but rather serve as an example of one preferred embodiment thereof. Many other variations are possible. For example, the invention applies to any local unit that performs digital communication with a remote system in which accurate frequency control of the local unit transmitter and receiver are essential. The basic system type is not restricted to the time division multiple access type of which GSM is an example but also applies to frequency division multiple access and code division multiple access types of systems. In the preferred embodiment the receiver and transmitter downconversion and upconversion in the local unit are described for simplicity of illustration as direct conversion from RF to baseband and baseband to RF, respectively. The AFC algorithm of the invention applies in obvious ways to local units having multiple downlink and uplink frequency conversion stages such as used in heterodyne receivers. The invention also applies to the case of a receiver downconversion structure that uses an intermediate frequency (IF) stage with IF sampling for the final downconversion stage. There are many obvious variations on the AFC algorithm that are possible in acquisition mode such as differing number of iterations on frequency estimation and associated VCXO adjustment. There are many obvious variations on the AFC algorithm in track mode such as the use of a higher order tracking loop than the Type 2 loop of the preferred embodiment or differing track loop parameter values giving similar performance.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the spirit and scope of the invention as set forth herein and defined in the claims.

I claim:

1. A system for reducing transmitter and receiver radio frequency error in a local unit, wherein the local unit transmits and receives radio signals bearing digital data modulation to and from a remote unit, said local unit comprising
   (a) a frequency downconversion means and an analog-to-digital conversion means for converting said received radio signals into received complex baseband digital signal samples,
   (b) first inducing means for inducing a first frequency offset in the baseband digital signal samples,
   (c) a digital data demodulator to extract the received data from rotated received digital samples,
   (e) a digital data modulator means for generation of complex uplink baseband digital samples containing data modulation,
   (f) second inducing means for inducing a second frequency offset in the uplink baseband digital samples,
   (g) means for digital-to-analog conversion of said frequency offset uplink baseband digital samples,
   (h) means for frequency upconversion to produce a radio transmission signal, and
   (i) whereby accurate transmitter and receiver frequencies are maintained in a track mode, and frequency quantization errors are substantially reduced relative to AFC loops that employ conventional VCXO frequency control means.

2. The system of claim 1 wherein said first inducing means comprises a downlink phase rotator means to produce complex digital phase rotation of said received baseband digital signal samples such that a frequency offset is induced in the samples in accordance with a downlink frequency offset command.

3. The system of claim 1 wherein said second inducing means comprises an uplink phase rotator means to produce complex digital phase rotation of said complex uplink baseband digital samples such that a frequency offset is induced in the uplink samples in accordance with an uplink frequency offset command.

4. The system of claim 1 wherein
   (a) said first inducing means comprises a downlink phase rotator means to produce complex digital phase rotation of said received baseband digital signal samples such that a frequency offset is induced in the samples in accordance with a downlink frequency offset command, and (b) said second inducing means comprises an uplink phase rotator means to produce complex digital phase rotation of said complex uplink baseband digital samples such that a frequency offset is induced in the uplink samples in accordance with an uplink frequency offset command.

5. The system of claim 1 wherein
(a) said second inducing means comprises an uplink phase rotator means to produce complex digital phase rotation of said complex uplink baseband digital samples such that a frequency offset is induced in the uplink samples in accordance with an uplink frequency offset command, and
(b) means for frequency upconversion of said phase-rotated complex uplink baseband digital samples to produce the radio transmission signal.

6. A method for reducing transmitter and receiver radio frequency error in a local unit, wherein the local unit transmits and receives radio signals bearing digital data modulation to and from a remote unit, the method comprising the steps of:
(a) downconverting the radio frequency of a received radio signal to a complex analog baseband signal and further converting said analog baseband signal to digital baseband complex samples,
(b) inducing a downlink frequency offset in the digital baseband complex samples,
(c) demodulating modulated data contained in the downlink frequency offset digital samples,
(d) producing complex uplink baseband digital data modulation samples for transmission to a remote unit,
(e) inducing an uplink frequency offset in the uplink baseband digital data modulation samples,
(f) converting said uplink frequency offset digital data modulation samples to analog form, and
(g) upconverting said converted uplink frequency offset modulation samples to the radio transmission frequency of a local unit, whereby accurate transmitter and receiver frequencies are maintain ed in a track mode, and frequency quantization error is substantially reduced relative to conventional AFC loops employing VCXO frequency control.

7. The method of claim 6 wherein said step of inducing a downlink frequency offset comprises rotating a complex phase of said received digital baseband complex samples to induce a downlink phase rotator frequency offset command.

8. The method of claim 6 wherein said step of inducing an uplink frequency offset comprises rotating a complex phase of said uplink baseband digital data modulation samples to induce an uplink frequency offset in the samples in accordance with an uplink phase rotator frequency offset command.

9. The method of claim 6 wherein
(a) said step of inducing a downlink frequency offset comprises rotating a complex phase of said received digital baseband complex samples to induce a downlink phase rotator frequency offset command, and
(b) said step of inducing an uplink frequency offset comprises rotating a complex phase of said uplink baseband digital data modulation samples to induce an uplink frequency offset in the samples in accordance with an uplink phase rotator frequency offset command.

10. The method of claim 6 wherein
(a) said step of inducing an uplink frequency offset comprises rotating a complex phase of said uplink baseband digital data modulation samples to induce an uplink frequency offset in the samples in accordance with an uplink phase rotator frequency offset command and
(b) said step of converting said uplink frequency offset digital data modulation samples comprises rotating said complex uplink baseband modulation samples to analog form and upconverting frequency to the radio transmission frequency of the local unit.

11. A system for reducing transmitter and receiver radio frequency error in a local unit,
wherein the local unit transmits and receives radio signals bearing digital data modulation to and from a remote unit, said local unit comprising:
(a) a frequency downconverter and an analog-to-digital converter for converting said received radio signals into received complex baseband digital signal samples,
(b) a downlink phase rotator to produce complex digital phase rotation of said received baseband digital signal samples such that a frequency offset is induced in the samples in accordance with a downlink frequency offset command,
(c) a frequency estimator for estimation of the receiver frequency error by processing of said phase rotated received baseband digital samples,
(d) a digital data demodulator to extract received data from the rotated received digital samples,
(e) a digital data modulator for generation of complex uplink baseband digital samples containing data modulation,
(f) an uplink phase rotator to produce complex digital phase rotation of said complex uplink baseband digital samples such that a frequency offset is induced in the uplink samples in accordance with an uplink frequency offset command,
(g) a digital-to-analog converter for converting said phase-rotated complex uplink baseband digital samples,
(h) a frequency upconverter for frequency upconversion to produce a radio transmission signal,
(i) a frequency synthesizer and a voltage controlled oscillator (VCO) to produce local oscillator signals to serve as mixer signals for said frequency upconversion means and frequency downconverter, said mixer signals being phase locked to a frequency reference signal,
(j) a reference oscillator to produce said frequency reference signal, and
(k) an automatic frequency controller (AFC) means operating in a track mode to produce said downlink frequency offset command for the downlink phase rotator, the downlink frequency offset command forming a feedback control loop responsive to said receiver frequency error estimate, and AFC generator to generate said uplink frequency offset command by a scale factor, whereby accurate transmitter and receiver frequencies are maintained in a track mode, and frequency quantization errors are substantially reduced relative to AFC loops that employ conventional voltage controlled crystal oscillator (VCXO) frequency control means.

12. The system of claim 11 wherein said reference oscillator is a VCXO with associated digital to analog converter (DAC) to support digital control of said VCXO wherein the VCXO frequency is linearly responsive to digital VCXO command input to said DAC, further comprising:

(a) an AFC acquisition mode, said AFC acquisition mode including initialization means for a VCXO command to be set to a nominal frequency command, first AFC means to produce a VCXO command update for reduction of transmitter and frequency error in response to said frequency error estimate, and second AFC means for successive repetition of said VCXO updates for successive reduction of initial receiver and transmitter frequency error to a magnitude that is small enough for accurate data demodulation and transition to a track mode, and wherein downlink and uplink phase rotator commands are fixed at zero value during said acquisition mode, (b) a track mode, said track mode including third AFC means for production of the uplink and downlink phase rotator commands to null receiver and transmitter frequency error in response to estimation of frequency error in accordance with linear feedback control loop principles, and (c) during said track mode fourth AFC means for scheduled adjustment of the VCXO command for reduction of the magnitude of downlink phase rotator offset command whenever the magnitude of said offset command exceeds a pre-determined limit L, and fifth AFC means for scheduled simultaneous adjustments to downlink phase rotator and uplink phase rotator frequency offset commands such that the step in receiver and transmitter frequency error caused by quantization error from said VCXO frequency adjustment are substantially and instantaneously canceled by said phase rotator adjustments, said scheduling of VCXO command, downlink frequency offset command, and uplink frequency offset command timed to occur during an idle interval when neither transmission nor reception by the local unit is in progress, whereby in acquisition mode initial frequency errors of the frequency reference such as caused by crystal temperature sensitivity and aging are substantially removed, whereby in the tracking mode local unit ratio transmission and reception frequency errors are minimized by use of uplink and downlink phase rotators having relatively fine frequency resolution as the primary means of frequency tracking adjustment, with the relatively coarse VCXO frequency adjustments utilized only in the contingency that the downlink phase rotator frequency offset magnitude exceeds a predetermined limit, and whereby in the tracking mode a VCXO frequency adjustment occurs whenever the downlink frequency offset of the downlink phase rotator exceeds a pre-determined limit, thereby providing a mechanism for maintenance of a maximum permissible offset of received and transmitted signals relative to respective receiver and transmitter filter center frequencies, and whereby in the tracking mode whenever said VCXO frequency adjustment does occur, the resultant effects of a jump in VCXO reference frequency on signal transmission and reception frequency by the local unit are substantially mitigated by cancellation by downlink and uplink phase rotators, and whereby in track mode scheduling of said VCXO adjustment is scheduled to occur when transmitter and receiver are idle.

13. The system of claim 12 wherein said AFC acquisition mode further comprises means for measurement of VCXO temperature and means for addition of an increment to the VCXO nominal frequency command wherein said increment is dependent on said temperature measurement and calculated to cancel the VCXO reference frequency error caused by VCXO temperature sensitivity, whereby the receiver and transmitter frequency error present at the initiation of said acquisition mode due to VCXO temperature sensitivity is substantially removed, thereby facilitating reduction in acquisition time or the use of a lower cost VCXO.

14. The system of claim 12 wherein said AFC acquisition mode further comprises:

(a) means for storage of computational parameters in nonvolatile memory, (b) means for storage of the VCXO command for nominal reference frequency in said non-volatile memory, and (c) means to update said VCXO command for nominal reference frequency at the end of each successful acquisition mode, whereby VCXO frequency error caused by VCXO crystal aging accumulated since prior local unit operation is substantially removed after each successful acquisition mode by the local unit, thereby facilitating reduction in acquisition time or the use of a lower cost VCXO.

15. The system of claim 12 wherein said fifth AFC during track mode produces downlink phase rotator frequency offset commands in accordance with one of a linear Type 2 or higher order tracking loop controller, whereby receiver and transmitter frequency errors having the form of ramp or higher order frequency changes caused by dynamic temperature conditions are tracked out by the downlink and uplink phase rotator frequency offset commands in accordance with linear feedback control principles, thereby substantially reducing receiver and transmitter frequency errors in track mode caused by dynamic temperature variations of the VCXO.

16. The system of claim 12 further comprising:

(a) means during the track mode for receiving and demodulating control data received from the remote unit wherein said control data indicates local unit transmitter frequency error as measured by the remote unit, and (b) AFC controller means in said track mode for subtracting said transmitter frequency error measurement from the uplink rotator frequency offset command, whereby local unit transmitter error caused by Doppler shift is removed.

17. The system of claim 12 wherein:

(a) the uplink data modulation is of a class of continuous phase modulation, and (b) the data modulator means are configured so that phase is an explicit modulator processing variable, and (c) the uplink phase rotator means produce phase rotation by addition of incremental phase to said modulator phase variable to induce a frequency offset commensurate with the uplink frequency offset command, whereby complexity of the uplink phase rotator is substantially reduced because of the absence of complex multiplication operations ordinarily required to produce uplink phase rotation.

18. The system of claim 11 wherein said reference oscillator is a VCXO with associated digital to analog converter (DAC) for digital control and the VCXO frequency is responsive to digital VCXO command input to said DAC, further comprising:

(a) an AFC acquisition mode, said AFC acquisition mode including sixth AFC means to produce a VCXO frequency update wherein a VCXO command is produced for reduction of transmitter and frequency error in response to said frequency error estimate, and AFC controller means for successive repetition of said VCXO updates for successive reduction of initial receiver and transmitter frequency error to a magnitude that is small enough for reliable data demodulation and transition to a track mode, wherein downlink and uplink phase rotator commands are fixed at zero value during said acquisition mode, (b) a track mode, said track mode including seventh AFC means for production of the uplink and downlink phase rotator commands to null receiver and transmitter frequency error in response to estimation of frequency error in accordance with linear feedback control loop principles, and (c) a fixed VCXO command in said track mode, whereby in said acquisition mode initial frequency errors of the frequency reference such as caused by crystal temperature sensitivity and aging are sufficiently reduced for reliable data demodulation, whereby in the track mode local unit ratio transmission and reception frequency errors are substantially reduced by use of uplink and downlink phase rotators having relatively fine frequency resolution in comparison to VCXO corrections normally used and having relatively coarse frequency resolution.

19. The system of claim 12 wherein parameter L therein set to infinity.

20. A method for reducing transmitter and receiver radio frequency error in a local unit, wherein the local unit transmits and receives radio signals bearing digital data modulation to and from a remote unit, the method comprising the steps of:

(a) downconverting the radio frequency of said received radio signal to a complex analog baseband signal and further converting said analog baseband signal to digital baseband complex samples, (b) rotating the complex phase of said received digital baseband complex samples to induce a downlink frequency offset in the samples in accordance with a downlink phase rotator frequency offset command, (c) estimating receiver frequency error by processing said phase rotated received baseband digital complex samples, (d) demodulating modulated data contained in the phase rotated received digital complex samples, (e) calculating complex uplink baseband digital data modulation samples for transmission to the remote unit, (f) rotating the complex phase of said uplink baseband digital data modulation samples to induce an uplink frequency offset in the samples in accordance with an uplink phase rotator frequency offset command, (g) converting said rotated complex baseband frequency offset modulation samples to analog form and, (h) upconverting said converted frequency offset modulation samples to the radio transmission frequency of the local unit, (i) generating local oscillator signals to serve as mixer signals for respective frequency upconversion and downconversion operations by phase locking local oscillator signals to a frequency reference signal, (j) generating said frequency reference signal by a reference oscillator, and (k) generating an automatic frequency converter (AFC) feedback control signal from said receiver frequency error estimate to serve as said downlink phase rotator frequency offset command, and producing said uplink phase rotator frequency offset command with a value equal to the downlink frequency offset command multiplied by a scale factor, whereby accurate transmitter and receiver frequencies are maintained in a track mode, and frequency quantization error is substantially reduced relative to conventional AFC loops employing voltage controlled crystal oscillator (VCXO) frequency control.

21. The method of claim 20 wherein said crystal oscillator is a VCXO with associated digital-to-analog converter (DAC) to support digital control of said VCXO wherein the VCXO frequency is linearly responsive to digital VCXO command input to said DAC, further comprising the steps of:

(a) in an acquisition mode, first initializing the VCXO command to a nominal frequency command, then producing a VCXO command update to reduce the estimated frequency error, and successively repeating said VCXO updating to successively reduce transmitter and receiver frequency errors to a magnitude that is small enough for accurate data demodulation and transition to a track mode wherein downlink and uplink phase rotator commands are fixed at zero value throughout said acquisition mode, (b) forming in a track mode an AFC feedback control loop by using estimated frequency errors to produce uplink and downlink phase rotator frequency offset commands to null receiver and transmitter frequency errors in accordance with feedback control loop principles, and (c) adjusting the VCXO command during said track mode, according to a schedule in order to reduce the magnitude of said downlink phase rotator offset command whenever said magnitude exceeds predetermined limit L, and simultaneously adjusting uplink and downlink phase rotator frequency offset commands such that the step in receiver and transmitter frequency error caused by quantization error from said VCXO adjustment are substantially and instantaneously canceled by said phase rotator adjustments, and scheduling the VCXO adjustments to occur during an idle interval when neither signal transmission nor reception by the local unit occurs, whereby in acquisition mode initial frequency errors of the frequency reference such as caused by crystal temperature sensitivity and aging are substantially removed, whereby in tracking mode local unit ratio transmission and reception frequency errors are minimized by use of uplink and downlink phase rotators having relatively fine frequency resolution as the primary means of frequency tracking adjustment, with the relatively coarse VCXO frequency adjustments utilized only in the contingency that the downlink phase rotator frequency offset magnitude exceeds a predetermined limit, and whereby in tracking mode a VCXO frequency adjustment occurs whenever the downlink frequency offset of the downlink phase rotator exceeds a predetermined limit, thereby providing a control mechanism for imposition of a maximum permissible offset of received and transmitted signals relative to respective receiver and transmitter filter center frequencies, and whenever said contingency VCXO frequency adjustment does occur, the resultant effects of a jump in VCXO reference frequency on signal transmission and reception frequency by the local unit are substantially mitigated by cancellation by downlink and uplink phase rotators and scheduling the adjustment to occur when transmitter and receiver are idle.

22. The method of claim 21 further comprising the steps of:
    (a) measuring VCXO temperature at initiation of an acquisition mode, and
    (b) adding an increment dependent on said temperature measurement to said VCXO nominal frequency command wherein the increment is calculated to cancel the VCXO frequency error caused by VCXO temperature sensitivity,
        whereby the receiver and transmitter frequency errors present at the initiation of acquisition mode due to VCXO temperature sensitivity are substantially removed
        thereby facilitating reduction in acquisition time or the use of a lower cost VCXO.

23. The method of claim 21 during acquisition mode further comprising the steps of:
    (a) storing said VCXO nominal frequency command in non-volatile memory, and
    (b) updating the VCXO nominal frequency command stored in non-volatile memory at the end of each successful acquisition mode, wherein said updating is based on VCXO adjustments accumulated during said acquisition mode,
        whereby VCXO frequency error accumulated due to VCXO crystal aging since prior local unit operation is substantially removed after each successful acquisition mode operation by the local unit,
        thereby facilitating reduction in acquisition time or the use of a lower cost VCXO.

24. The method of claim 22 further comprising the steps of producing the uplink and downlink phase rotator frequency offset commands in accordance with one of linear Type 2 or higher order tracking loop controllers,
    whereby receiver and transmitter frequency offsets having the form of ramp input or higher order frequency change induced in the VCXO by dynamic temperature conditions are tracked out by the downlink and uplink phase rotator frequency offset commands in accordance with linear feedback control principles,
    thereby substantially reducing receiver and transmitter frequency errors in track mode caused by dynamic temperature variations of the VCXO.

25. The method of claim 22 further comprising the steps of:
    (a) receiving and demodulating in the track mode control data from the remote unit indicating local unit transmitter frequency error as measured by the remote unit, and
    (b) subtracting in the track mode said transmitter frequency error measurement from the uplink frequency offset command,
        whereby local unit transmitter frequency error caused by Doppler is removed.

26. The method of claim 22 wherein the data modulation is of a class of continuous phase data modulation and further comprising the steps of:
    (a) producing the modulated baseband complex samples such that phase appears explicitly as a phase processing variable, and
    (b) adding the uplink phase rotator incremental phase values directly to said phase processing variable to induce a frequency offset commensurate with the uplink frequency offset command,
        whereby complexity of the uplink phase rotator is substantially reduced because of the absence of multiplication operations ordinarily required to produce uplink phase rotation.

27. The method of claim 21 wherein said reference oscillator is a VCXO with associated digital-to-analog converter (DAC) for digital control and the VCXO frequency is responsive to digital VCXO command input to said DAC, further comprising the steps of:
    (a) in an acquisition mode, first initializing the VCXO command to a nominal frequency command, then producing a VCXO command update to reduce the estimated frequency error, and successively repeating said VCXO updating to successively reduce transmitter and receiver frequency errors to a magnitude that is small enough for accurate data demodulation and transition to a track mode, wherein with downlink and uplink phase rotator commands are fixed at zero value throughout said acquisition mode,
    (b) using in a track mode said receiver frequency error estimate for producing the uplink and downlink phase rotator frequency offset commands in accordance with feedback control loop principles, and
    (c) using a fixed value of VCXO command in said track mode,
        whereby in the acquisition mode initial frequency errors of the frequency reference such as caused by crystal temperature sensitivity and aging are reduced sufficiently for accurate data demodulation and transition to said track mode,
        whereby in the tracking mode local unit ratio transmission and reception frequency errors are substantially reduced by use of uplink and downlink phase rotators having relatively finer frequency resolution in comparison to VCXO corrections as normally used.

28. The method of claim 21 wherein the predetermined limit is set to infinity.

29. A system for reducing transmitter and receiver radio frequency error in a local unit, wherein the local unit transmits and receives radio signals bearing digital data modulation to and from a remote unit, said local unit comprising
    (a) a frequency downconversion means and an analog-to-digital conversion means for converting said received radio signals into received complex baseband digital signal samples,
    (b) first inducing means for inducing a first frequency offset in the baseband digital signal samples,
    (c) a digital data demodulator to extract the received data from rotated received digital samples,
    (d) a digital data modulator means for generation of complex uplink baseband digital samples containing data modulation,
    (e) second inducing means for inducing a second frequency offset in the uplink baseband digital samples,
    (f) means for digital-to-analog conversion of said frequency offset uplink baseband digital samples,
    (g) means for frequency upconversion to produce a radio transmission signal, and (h) whereby accurate transmitter and receiver frequencies are maintained in a track mode, and frequency quantization errors are substantially reduced relative to AFC loops that employ conventional VCXO frequency control means, and wherein said first inducing means comprises a downlink phase rotator means to produce complex digital phase rotation of said received baseband digital signal samples such that a frequency offset is induced in the samples in accordance with a downlink frequency offset command, and wherein said second inducing means comprises an uplink phase rotator means to produce complex digital phase rotation of said complex uplink baseband digital samples such that a frequency offset is induced in the uplink samples in accordance with an uplink frequency offset command, and wherein means for frequency upconversion comprises means for frequency upconversion of said phase-rotated complex uplink baseband digital samples to produce the radio transmission signal.

30. The system of claim 29 further comprising:
(a) frequency estimator means for estimation of receiver frequency error by processing of said phase rotated received baseband digital samples,
(b) reference oscillator means to produce a frequency reference signal,
(c) frequency synthesizer means and voltage controlled oscillator means (VCO) to produce local oscillator signals to serve as mixer signals for said frequency upconversion means and frequency downconversion means, said mixer signals being phase locked to said frequency reference signal,
(d) AFC means operating in a track mode to produce said downlink frequency offset command for the downlink phase rotator, the offset command forming a feedback control loop responsive to said receiver frequency error estimate, and
(e) AFC means to generate said uplink frequency offset command, the value of the uplink frequency offset command being related to the downlink frequency offset command by a scale factor.

31. A method for reducing transmitter and receiver radio frequency error in a local unit, wherein the local unit transmits and receives radio signals bearing digital data modulation to and from a remote unit, the method comprising the steps of:
(a) downconverting the radio frequency of a received radio signal to a complex analog baseband signal and further converting said analog baseband signal to digital baseband complex samples,
(b) inducing a downlink frequency offset in the digital baseband complex samples,
(c) demodulating modulated data contained in the downlink frequency offset digital samples,
(d) producing complex uplink baseband digital data modulation samples for transmission to a remote unit,
(e) inducing an uplink frequency offset in the uplink baseband digital data modulation samples,
(f) converting said uplink frequency offset digital data modulation samples to analog form, and
(g) upconverting said converted uplink frequency offset modulation samples to the radio transmission frequency of a local unit, whereby accurate transmitter and receiver frequencies are maintained in a track mode, and frequency quantization error is substantially reduced relative to conventional AFC loops employing VCXO frequency control, and wherein said step of inducing a downlink frequency offset comprises rotating a complex phase of said received digital baseband complex samples to induce a downlink phase rotator frequency offset command, and wherein said step of inducing an uplink frequency offset comprises rotating a complex phase of said uplink baseband digital data modulation samples to induce an uplink frequency offset in the samples in accordance with an uplink phase rotator frequency offset command, and wherein said step of converting said uplink frequency offset digital data modulation samples comprises rotating said complex uplink baseband modulation samples to analog form and upconverting frequency to the radio transmission frequency of the local unit.

32. The method of claim 31 further comprising the steps of:
(a) estimating receiver frequency error by processing said phase rotated received baseband digital complex samples,
(b) producing an automatic frequency converter (AFC) feedback control signal from said receiver frequency error estimate to serve as said downlink phase rotator frequency offset command, and
(c) producing said uplink frequency offset command with a value equal to the downlink frequency offset command multiplied by a scale factor.

33. A method for reducing transmitter and receiver radio frequency error in a local unit, wherein the local unit transmits and receives radio signals bearing digital data modulation to and from a remote unit, the method comprising the steps of:
(a) downconverting the radio frequency of a received radio signal to a complex analog baseband signal and further converting said analog baseband signal to digital baseband complex samples,
(b) inducing a downlink frequency offset in the digital baseband complex samples,
(c) demodulating modulated data contained in the downlink frequency offset digital samples,
(d) producing complex uplink baseband digital data modulation samples for transmission to a remote unit,
(e) inducing an uplink frequency offset in the uplink baseband digital data modulation samples,
(f) converting said uplink frequency offset digital data modulation samples to analog form,
(g) upconverting said converted uplink frequency offset modulation samples to the radio transmission frequency of a local unit, whereby accurate transmitter and receiver frequencies are maintained in a track mode, and frequency quantization error is substantially reduced relative to conventional AFC loops employing VCXO frequency control,
(h) producing a frequency reference signal by a reference oscillator, and
(i) producing local oscillator signals to serve as mixer signals for respective frequency upconversion and downconversion operations by phase locking local oscillator signals to said frequency reference signal.

* * * * *